United States Patent
Hase

(10) Patent No.: US 11,522,503 B2
(45) Date of Patent: Dec. 6, 2022

(54) TRANSMISSION LINE TRANSFORMER AND AMPLIFYING CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 159 days.

(21) Appl. No.: 16/550,493

(22) Filed: Aug. 26, 2019

(65) Prior Publication Data

US 2020/0076383 A1  Mar. 5, 2020

(30) Foreign Application Priority Data

Sep. 3, 2018  (JP) ............................. JP2018-164417
Jun. 18, 2019  (JP) ............................. JP2019-112969

(51) Int. Cl.
| H04B 3/00 | (2006.01) |
| H03H 7/38 | (2006.01) |
| H03F 3/19 | (2006.01) |
| H03F 1/56 | (2006.01) |
| H03F 3/45 | (2006.01) |

(52) U.S. Cl.
CPC ............... *H03F 3/19* (2013.01); *H03F 1/565* (2013.01); *H03F 3/45071* (2013.01); *H03H 7/38* (2013.01); *H04B 3/00* (2013.01); *H03F 2200/541* (2013.01)

(58) Field of Classification Search
CPC .. H03H 7/38; H03F 1/565; H03F 3/19; H03F 3/45071; H04B 3/00

See application file for complete search history.

(56) References Cited

U.S. PATENT DOCUMENTS

| 6,768,410 | B1 | 7/2004 | Yazaki et al. |
| 8,384,484 | B2 | 2/2013 | Winslow |
| 2008/0036536 | A1* | 2/2008 | Khorramabadi .... H01L 23/5227 330/252 |
| 2009/0085666 | A1 | 4/2009 | Ohnishi et al. |
| 2010/0102885 | A1 | 4/2010 | Heston et al. |
| 2011/0140787 | A1 | 6/2011 | Heston et al. |
| 2018/0183396 | A1* | 6/2018 | Komiak .................... H03F 1/56 |

FOREIGN PATENT DOCUMENTS

| JP | 2009-088770 A | 4/2009 |
| JP | 2011-244070 A | 12/2011 |
| KR | 10-2003-0025247 A | 3/2003 |

OTHER PUBLICATIONS

W. Alan Davis "Chapter Six Transmission Line Transformers", Radio Frequency Circuit Design, 2011, pp. 131-153, Second Edition, John Wiley & Sons, Inc.

* cited by examiner

*Primary Examiner* — Samuel S Outten
(74) *Attorney, Agent, or Firm* — Pearne & Gordon LLP

(57) ABSTRACT

A first transmission line and a second transmission line that are connected in series to each other are disposed at different positions in a thickness direction of a substrate. A third transmission line is disposed between the first transmission line and the second transmission line in the thickness direction of the substrate. The third transmission line includes a first end portion connected to one end portion of the first transmission line, and a second end portion that is AC-grounded. The first transmission line and the second transmission line are electromagnetically coupled to the third transmission line.

20 Claims, 20 Drawing Sheets

TRANSMISSION LINE TRANSFORMER AND AMPLIFYING CIRCUIT

This application claims priority from Japanese Patent Application No. 2018-164417 filed on Sep. 3, 2018, and claims priority from Japanese Patent Application No. 2019-112969 filed on Jun. 18, 2019. The content of this application is incorporated herein by reference in its entirety.

BACKGROUND OF THE DISCLOSURE

1. Field of the Disclosure

The present disclosure relates to a transmission line transformer and an amplifying circuit.

2. Description of the Related Art

There has been available a technique of using a transmission line transformer as an impedance matching circuit that is disposed between an output terminal of an amplifier and a load (U.S. Pat. No. 8,384,484). The transmission line transformer disclosed in U.S. Pat. No. 8,384,484 is constituted by two broadside-coupled transmission lines. In the configuration disclosed in U.S. Pat. No. 8,384,484, a plurality of transmission line transformers are cascade-connected to achieve a desired impedance transformation ratio. A basic transmission line transformer is described in "Chapter Six Transmission Line Transformers", Radio Frequency Circuit Design, Second Edition, by W. Alan Davis, Copyright (C) 2011 John Wiley & Sons, Inc.

BRIEF SUMMARY OF THE DISCLOSURE

In the configuration disclosed in U.S. Pat. No. 8,384,484, a plurality of transmission line transformers are cascade-connected to achieve a desired impedance transformation ratio because it is difficult to achieve a large impedance transformation ratio with a single transmission line transformer. This configuration leads to difficulty in reducing the size of the impedance matching circuit.

An object of the present disclosure is to provide a transmission line transformer capable of achieving a larger impedance transformation ratio than that in a transmission line transformer according to the related art. Another object of the present disclosure is to provide an amplifying circuit including the transmission line transformer.

According to preferred embodiments of the present disclosure, a transmission line transformer includes: a first transmission line and a second transmission line that are disposed at different positions in a thickness direction of a substrate and that are connected in series to each other; and a third transmission line that is disposed between the first transmission line and the second transmission line in the thickness direction of the substrate, that includes a first end portion connected to one end portion of the first transmission line, and that includes a second end portion that is AC-grounded. The first transmission line and the second transmission line are electromagnetically coupled to the third transmission line.

According to other preferred embodiments of the present disclosure, an amplifying circuit includes: an amplifying element that amplifies a high-frequency signal; and a transmission line transformer connected to an input terminal of the amplifying element or an output terminal of the amplifying element. The transmission line transformer includes: a first transmission line and a second transmission line that are disposed at different positions in a thickness direction of a substrate and that are connected in series to each other; and a third transmission line that is disposed between the first transmission line and the second transmission line in the thickness direction of the substrate, that includes a first end portion connected to one end portion of the first transmission line, the one end portion being connected to the amplifying element, and that includes a second end portion that is AC-grounded. The first transmission line and the second transmission line are electromagnetically coupled to the third transmission line.

An impedance transformation ratio larger than that in the related art can be obtained by using a single transmission line transformer. Thus, an impedance matching circuit constituted by the transmission line transformer can be reduced in size.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

First Embodiment

A transmission line transformer according to a first embodiment will be described with reference to FIGS. 1A, 1B, and 1C.

Figure 1A:
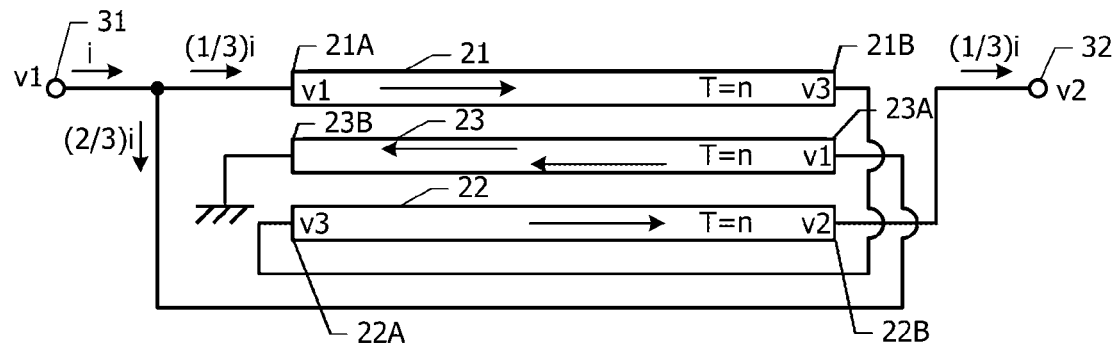
FIG. 1A is a schematic diagram for describing the operation principle of a transmission line transformer according to a first embodiment.

FIG. 1A is a schematic diagram for describing the operation principle of a transmission line transformer 20 according to the first embodiment. The transmission line transformer 20 according to the first embodiment includes a first transmission line 21, a second transmission line 22, and a third transmission line 23 that are disposed on a surface of a substrate or inside the substrate. The vertical direction in FIG. 1A corresponds to the thickness direction of the substrate. The first transmission line 21 and the second transmission line 22 are disposed at different positions in the thickness direction of the substrate. The third transmission line 23 is disposed between the first transmission line 21 and the second transmission line 22 in the thickness direction of the substrate.

One end portion of the third transmission line 23 is referred to as a first end portion 23A, and the other end portion thereof is referred to as a second end portion 23B. One end portion of the first transmission line 21 is referred to as a third end portion 21A, and the other end portion thereof is referred to as a fourth end portion 21B. One end portion of the second transmission line 22 is referred to as a fifth end portion 22A, and the other end portion thereof is referred to as a sixth end portion 22B. The first end portion 23A of the third transmission line 23 is connected to the third end portion 21A of the first transmission line 21, and the second end portion 23B is grounded. Here, "grounding" includes both DC grounding and AC grounding. The third end portion 21A of the first transmission line 21 is connected to a first terminal 31 for connecting to an external circuit. The fourth end portion 21B of the first transmission line 21 is connected to the fifth end portion 22A of the second transmission line 22. The sixth end portion 22B of the second transmission line 22 is connected to a second terminal 32 for connecting to an external circuit. That is, the first transmission line 21 and the second transmission line 22 are connected in series to each other to form a transmission line, and both ends of the transmission line correspond to the first terminal 31 and the second terminal 32.

The first transmission line 21 and the second transmission line 22 are each electromagnetically coupled to the third transmission line 23. In the first embodiment, the coupling between the first transmission line 21 and the third transmission line 23 corresponds to the coupling between coils having the same number of turns T, and also the coupling between the second transmission line 22 and the third transmission line 23 corresponds to the coupling between coils having the same number of turns T. For example, all of the first transmission line 21, the second transmission line 22, and the third transmission line 23 have the number of turns T equal to n.

Next, the definition of the number of turns T in this specification will be described with reference to FIGS. 2A and 2B.

Figure 2A:
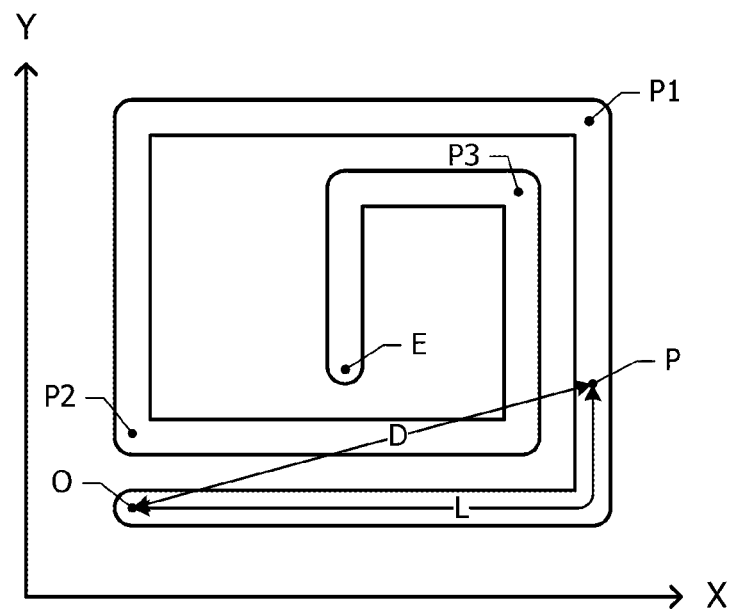
FIG. 2A is a diagram illustrating an example of a coil pattern.

FIG. 2A is a diagram illustrating an example of a coil pattern. An X-Y orthogonal coordinate system is defined in which an outer end portion of the coil pattern is an origin point O. This coil pattern has a path extending from the origin point O to an end point E, which is an inner end portion of the coil pattern. The path length from the origin point O to a point P on the coil pattern is represented by L. The Euclidean distance from the origin point O to the coordinates of the point P is represented by D.

Figure 2B:
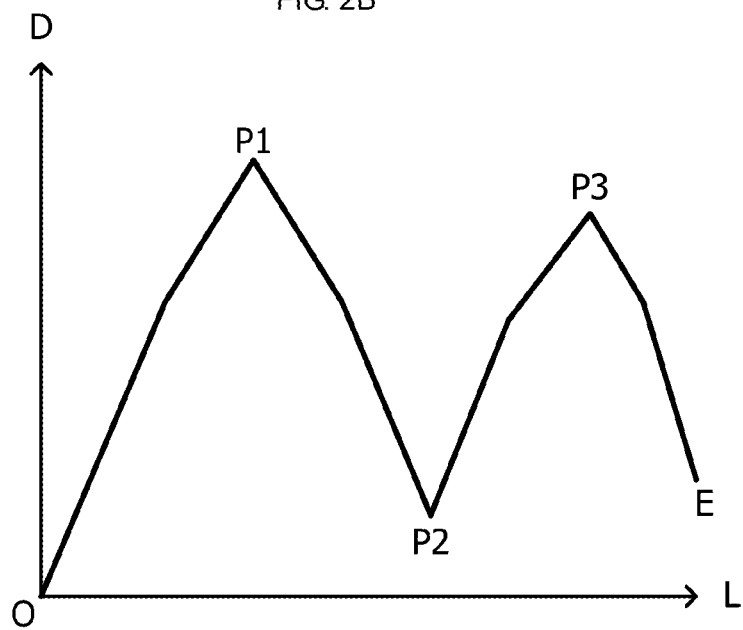
FIG. 2B is a graph illustrating the relationship between a path length and a Euclidean distance at each point from an origin point to an end point E of the coil pattern.

FIG. 2B is a graph illustrating the relationship between the path length L and the Euclidean distance D at each point from the origin point O to the end point E of the coil pattern. In the coil pattern illustrated in FIG. 2A, the Euclidean distance D has a first maximum value at a point P1, has a minimum value at a point P2, and has a second maximum value at a point P3 before the end point E. The number of maximum values in the graph illustrating the relationship between the path length L and the Euclidean distance D is defined as the number of turns T of the coil pattern. The number of turns T of the coil pattern illustrated in FIG. 2A is 2.

The alternating currents flowing through the first transmission line 21, the second transmission line 22, and the third transmission line 23 will be described. The current flowing from the first terminal 31 toward the second terminal 32 first flows through the first transmission line 21 from the third end portion 21A toward the fourth end portion 21B, and then flows through the second transmission line 22 from the fifth end portion 22A toward the sixth end portion 22B. The magnitude of the alternating current flowing through the first transmission line 21 is equal to the magnitude of the alternating current flowing through the second transmission line 22. The alternating current flowing through the first transmission line 21 induces an odd-mode current flowing through the third transmission line 23 from the first end portion 23A toward the second end portion 23B, and the alternating current flowing through the second transmission line 22 induces an odd-mode current flowing through the third transmission line 23 from the first end portion 23A toward the second end portion 23B. The direction in which the odd-mode current induced in the third transmission line 23 flows is opposite to the direction in which the alternating current flows through the first transmission line 21 and the second transmission line 22. The odd-mode current induced by the current flowing through the first transmission line 21 and the odd-mode current induced by the current flowing through the second transmission line 22 are equal to each other in terms of the magnitude and the direction.

The odd-mode current induced by the current flowing through the first transmission line 21 and the odd-mode current induced by the current flowing through the second transmission line 22 flow through the third transmission line 23 in a superimposed manner. Thus, the magnitude of the odd-mode current induced in the third transmission line 23 is twice as much as the magnitude of the current flowing through a series circuit formed of the first transmission line 21 and the second transmission line 22. When the magnitude of the current flowing from the first terminal 31 into the transmission line transformer 20 is represented by i, the magnitude of the current flowing through the series circuit formed of the first transmission line 21 and the second transmission line 22 is represented by ($1/3$)i, and the magnitude of the current flowing through the third transmission line 23 is represented by ($2/3$)i. The magnitude of the current outputted from the second terminal 32 is represented by ($1/3$)i.

Next, voltages will be described. The voltage at the first terminal 31 is represented by v1, and the voltage at the second terminal 32 is represented by v2. The voltage at the third end portion 21A of the first transmission line 21 and the voltage at the first end portion 23A of the third transmission line 23 are equal to the voltage v1 at the first terminal 31. The voltage at the sixth end portion 22B of the second transmission line 22 is equal to the voltage v2 at the second terminal 32. The voltage at the fourth end portion 21B of the first transmission line 21 is represented by v3. The voltage at the fifth end portion 22A of the second transmission line 22 is equal to the voltage v3 at the fourth end portion 21B of the first transmission line 21. The voltage at the second end portion 23B of the third transmission line 23 is 0 V.

The potential difference between the third end portion 21A and the fourth end portion 21B of the first transmission line 21 is equal to the potential difference between the second end portion 23B and the first end portion 23A of the third transmission line 23, and thus v1−v3=0−v1 holds. Similarly, v3−v2=0−v1 holds between the second transmission line 22 and the third transmission line 23. The solution of the simultaneous equations is 3×v1=v2. In other words, the voltage v2 at the second terminal 32 is three times as much as the voltage v1 at the first terminal 31.

When a load with an impedance R2 is connected to the second terminal 32, v2=($1/3$)i×R2 holds. The impedance seen on the load side from the first terminal 31 is represented by R1, and then v1=R1×i holds. The solution of these equations is R1=($1/9$)R2. In other words, the impedance R1 seen on the load side from the first terminal 31 is $1/9$ times as much as the impedance R2 of the load connected to the second terminal 32. On the other hand, when a load is connected to the first terminal 31, the impedance seen on the load side from the second terminal 32 is 9 times as much as the impedance of the load connected to the first terminal 31. In this way, the transmission line transformer 20 according to the first embodiment functions as an impedance transformation circuit having an impedance transformation ratio of about 9.

Figure 1B:
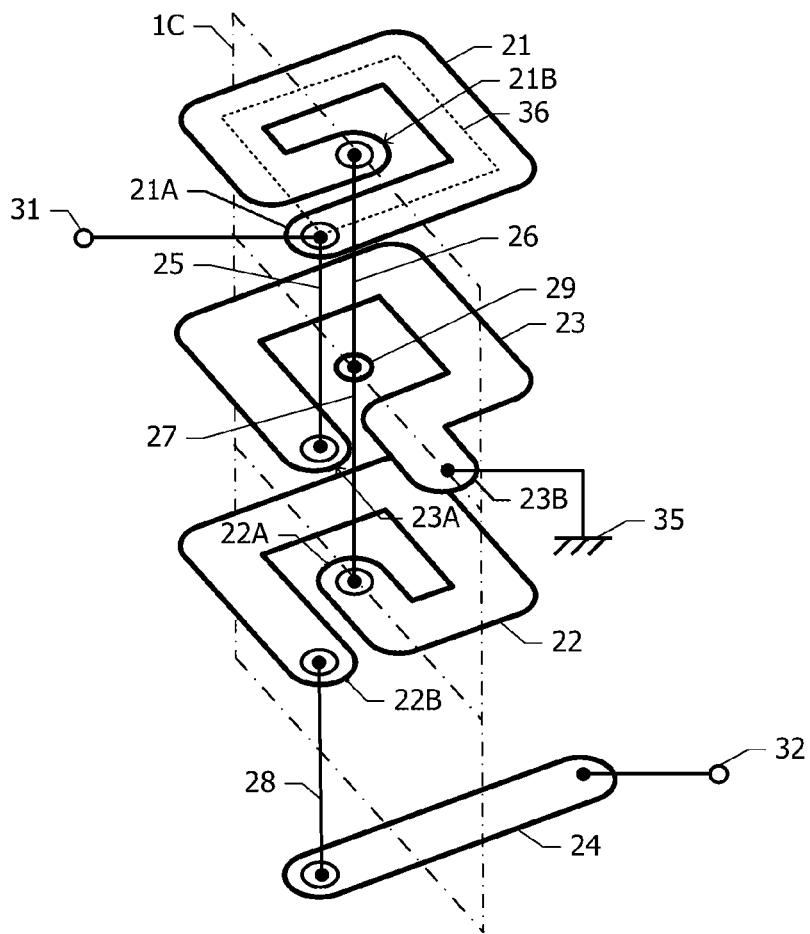
FIG. 1B is a schematic perspective view of the transmission line transformer according to the first embodiment.
Figure 1C:
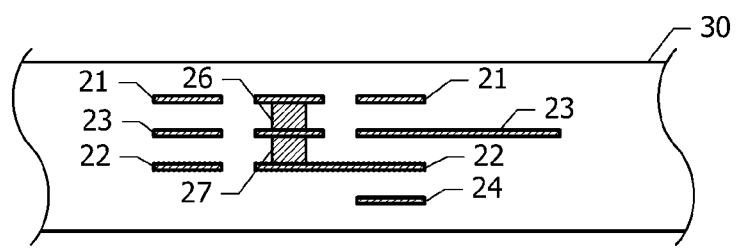
FIG. 1C is a cross-sectional view taken along a dot-and-dash line 1C in FIG. 1B.

FIG. 1B is a schematic perspective view of the transmission line transformer 20 according to the first embodiment, and FIG. 1C is a cross-sectional view taken along a dot-and-dash line 1C in FIG. 1B.

The first transmission line 21 and the second transmission line 22 are disposed at different positions in the thickness direction of a substrate 30 (FIG. 1C). The substrate 30 may be made of, for example, a magnetic insulating material or a dielectric material. Examples of a substrate made of a dielectric material include a resin substrate and a ceramic substrate. Alternatively, an insulating layer formed on a semiconductor substrate may be used as the substrate 30. The third transmission line 23 is disposed between the first transmission line 21 and the second transmission line 22. The first transmission line 21, the second transmission line 22, and the third transmission line 23 are each constituted by a substantially spiral conductor pattern whose dimension is larger in the width direction than in the thickness direction. In addition, an extended line 24 and a ground conductor 35 (FIG. 1B) are disposed in the substrate 30.

The third end portion 21A of the first transmission line 21, the first end portion 23A of the third transmission line 23, and the sixth end portion 22B of the second transmission line 22 are disposed at positions that overlap each other in plan view. The fourth end portion 21B of the first transmission line 21 and the fifth end portion 22A of the second transmission line 22 are disposed at positions that overlap each other in plan view. In the same layer as the third transmission line 23, a conductor pattern 29 is disposed at the position corresponding to the fourth end portion 21B of the first transmission line 21. A via conductor 25 connects the third end portion 21A of the first transmission line 21 and the first end portion 23A of the third transmission line 23. A via conductor 26 connects the fourth end portion 21B of the first transmission line 21 and the conductor pattern 29, and a via conductor 27 connects the conductor pattern 29 and the fifth end portion 22A of the second transmission line 22. A via conductor 28 connects the sixth end portion 22B of the second transmission line 22 and the extended line 24. The third end portion 21A of the first transmission line 21 is connected to the first terminal 31, and the extended line 24 is connected to the second terminal 32. The second end portion 23B of the third transmission line 23 is connected to the ground conductor 35.

In plan view, the first transmission line 21 extends to turn in a first turn direction (counterclockwise in FIG. 1B) from the third end portion 21A. The third transmission line 23 extends to turn in a second turn direction (clockwise in FIG. 1B), which is opposite to the first turn direction, from the first end portion 23A. The second transmission line 22 extends to turn in the first turn direction from the fifth end portion 22A.

In plan view, a substantially square-shaped closed virtual loop 36 is defined. The third end portion 21A of the first transmission line 21, the first end portion 23A of the third transmission line 23, and the sixth end portion 22B of the second transmission line 22 are disposed at the same position on the loop 36 in plan view. The fourth end portion 21B of the first transmission line 21, the conductor pattern 29, and the fifth end portion 22A of the second transmission line 22 are disposed at the same position inside the loop 36 in plan view. The third end portion 21A, the first end portion 23A, and the sixth end portion 22B may be disposed so as to partially overlap each other in plan view. Similarly, the fourth end portion 21B, the conductor pattern 29, and the fifth end portion 22A may be disposed so as to partially overlap each other in plan view.

The first transmission line 21 extends about one round along the loop 36 in the first turn direction from the third end portion 21A, and extends inward from the loop 36 to reach the fourth end portion 21B. The third transmission line 23 extends about one round along the loop 36 in the second turn direction from the first end portion 23A, and extends outward from the loop 36 to reach the second end portion 23B. The second transmission line 22 extends from the fifth end portion 22A located inside the loop 36 toward the loop 36, and extends about one round along the loop 36 in the first turn direction to reach the sixth end portion 22B. In this way, the first transmission line 21, the second transmission line 22, and the third transmission line 23 each constitute a coil pattern whose number of turns T is 1.

In the first transmission line 21, the second transmission line 22, and the third transmission line 23, the portions along the loop 36 overlap each other at least partially in plan view. Thus, the first transmission line 21 is capacitively coupled to the third transmission line 23, and also the second transmission line 22 is capacitively coupled to the third transmission line 23.

Next, excellent effects of the first embodiment will be described.

A transmission line transformer having a two-layer structure formed of the first transmission line 21 and the third transmission line 23 has an impedance transformation ratio of about 4. In contrast, the transmission line transformer 20 according to the first embodiment has an impedance transformation ratio of about 9, which is larger than the impedance transformation ratio of the transmission line transformer having a two-layer structure. This is because the electromagnetic coupling of the third transmission line 23 with both the first transmission line 21 and the second transmission line 22 doubles the odd-mode current induced in the third transmission line 23.

Furthermore, because the first transmission line 21, the second transmission line 22, and the third transmission line 23 are disposed so as to substantially overlap each other in plan view, an increase in the impedance transformation ratio does not cause an increase in the area occupied by the transmission line transformer 20 in the substrate 30. Thus, the size of the transmission line transformer 20 can be reduced compared to the configuration of achieving a large impedance transformation ratio by cascade-connecting a plurality of transmission line transformers each having a small impedance transformation ratio.

Next, a transmission line transformer according to a modification example of the first embodiment will be described.

In the first embodiment, the loop 36 (FIG. 1B) along which the first transmission line 21, the second transmission line 22, and the third transmission line 23 extend is substantially square-shaped. Alternatively, the loop 36 may have another shape. For example, the loop 36 may be substantially circular, elliptical, rectangular, polygonal, or the like. In the first embodiment, the series circuit formed of the first transmission line 21 and the second transmission line 22 extends to turn counterclockwise from the third end portion 21A, and the third transmission line 23 extends to turn clockwise. Alternatively, these turn directions may be reversed.

In the first embodiment, the first transmission line 21, the second transmission line 22, and the third transmission line 23 each extend about one round along the loop 36. In each of the first transmission line 21, the second transmission line 22, and the third transmission line 23, the length of the portion along the loop 36 may be shorter than the length of the one round. Even with this structure, the number of turns T can be 1 according to the definition of the number of turns T in this specification (FIGS. 2A and 2B). To achieve sufficient electromagnetic coupling, it is preferable that the number of turns T be 1 or more in each of the first transmission line 21, the second transmission line 22, and the third transmission line 23.

In the first embodiment, the conductor patterns constituting the first transmission line 21, the second transmission line 22, and the third transmission line 23 have widths that are substantially equal to each other.

Alternatively, the conductor pattern of the third transmission line 23 may have a width larger than or equal to the width of each of the first transmission line 21 and the second transmission line 22. In this case, the conductor pattern of the first transmission line 21 and the conductor pattern of the second transmission line 22 may preferably be disposed inside the conductor pattern of the third transmission line 23 in the width direction of the conductor patterns in plan view. This arrangement enables the capacitive coupling between the first transmission line 21 and the third transmission line 23 and the capacitive coupling between the second transmission line 22 and the third transmission line 23 to be increased. The increase in the capacitive coupling makes it possible to reduce loss when inducing an odd-mode current in the third transmission line 23. As a result, insertion loss is reduced, and an impedance transformation ratio closer to a theoretical transformation ratio is obtained.

In the first embodiment, as illustrated in FIG. 1B, the extended line 24 is disposed in a layer different from the layer of the second transmission line 22, and the second transmission line 22 and the second terminal 32 are connected to each other with the extended line 24 interposed therebetween. Alternatively, the extended line 24 and the second transmission line 22 may be disposed in the same layer. In this configuration, the second transmission line 22 and the extended line 24 are formed of a common conductor pattern, and thus the sixth end portion 22B of the second transmission line 22 is not clearly specified. In this case, a portion at which the second transmission line 22 deviates from the loop 36 may be defined as the sixth end portion 22B.

In the first embodiment, as illustrated in FIG. 1B, the end of the portion extending outward from the portion along the loop 36 of the third transmission line 23 is defined as the second end portion 23B. Alternatively, the end of the portion along the loop 36 may be defined as the second end portion 23B, and the portion extending from the second end portion 23B to the ground conductor 35 may be regarded as a part of the extended line 24.

Similarly, the end of the portion along the loop 36 of the first transmission line 21 may be defined as the fourth end portion 21B, and the portion extending inward from the loop 36 from the fourth end portion 21B may be regarded as a wiring line that connects the first transmission line 21 and the second transmission line 22. Similarly, the end of the portion along the loop 36 of the second transmission line 22 may be defined as the fifth end portion 22A, and the portion extending inward from the loop 36 from the fifth end portion 22A may be regarded as a wiring line that connects the first transmission line 21 and the second transmission line 22.

Second Embodiment

A transmission line transformer 20 according to a second embodiment will be described with reference to FIGS. 3A and 3B. The same components as those of the transmission line transformer 20 according to the first embodiment will not be described.

Figure 3A:
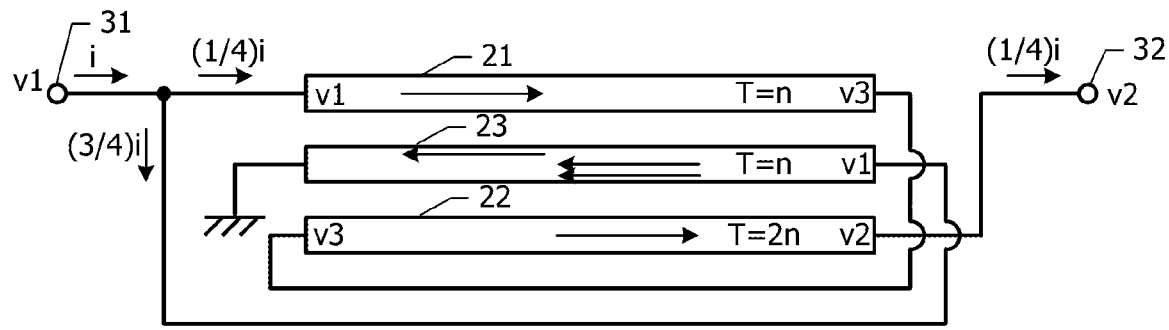
FIG. 3A is a schematic diagram for describing the operation principle of a transmission line transformer according to a second embodiment.

FIG. 3A is a schematic diagram for describing the operation principle of the transmission line transformer 20 according to the second embodiment. In the first embodiment, the first transmission line 21, the second transmission line 22, and the third transmission line 23 have the same number of turns T. In the second embodiment, the number of turns T of each of the first transmission line 21 and the third transmission line 23 is n, whereas the number of turns T of the second transmission line 22 is 2n. That is, the number of turns T of the second transmission line 22 is twice as many as the number of turns T of each of the first transmission line 21 and the third transmission line 23.

In this case, the magnitude of the odd-mode current induced in the third transmission line 23 by the alternating current flowing through the second transmission line 22 is twice as much as the magnitude of the alternating current flowing through the second transmission line 22. Also, an odd-mode current is induced in the third transmission line 23 by the alternating current flowing through the first transmission line 21, as in the first embodiment. Thus, the magnitude of the odd-mode current induced in the third transmission line 23 is three times as much as the magnitude of the alternating current flowing through the series circuit formed of the first transmission line 21 and the second transmission line 22. When the magnitude of the current flowing from the first terminal 31 into the transmission line transformer 20 is represented by i, the magnitude of the current flowing through the series circuit formed of the first transmission line 21 and the second transmission line 22 is represented by (¼)i, and the magnitude of the current flowing through the third transmission line 23 is represented by (¾)i. The magnitude of the current outputted from the second terminal 32 is represented by (¼)i.

Regarding the voltages, v1−v3=0−v1 holds between the first transmission line 21 and the third transmission line 23, as in the first embodiment. 2(0−v1)=v3−v2 holds between the second transmission line 22 and the third transmission line 23. The solution of the simultaneous equations is v2=4×v1. That is, the voltage v2 at the second terminal 32 is four times as much as the voltage v1 at the first terminal 31.

When a load is connected to the second terminal 32, the impedance seen on the load side from the first terminal 31 is 1/16 times as much as the impedance of the load connected to the second terminal 32. On the other hand, when a load is connected to the first terminal 31, the impedance seen on the load side from the second terminal 32 is 16 times as much as the impedance of the load connected to the first terminal 31. In this way, the transmission line transformer 20 according to the second embodiment functions as an impedance transformation circuit having an impedance transformation ratio of about 16.

Figure 3B:
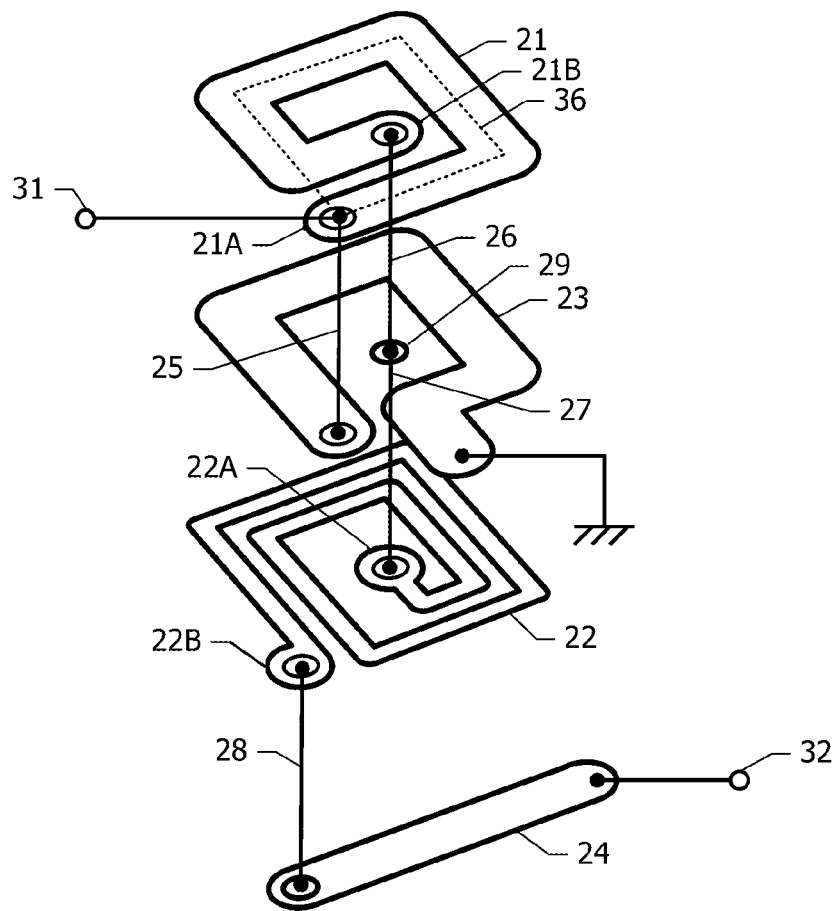
FIG. 3B is a schematic perspective view of the transmission line transformer according to the second embodiment.

FIG. 3B is a schematic perspective view of the transmission line transformer 20 according to the second embodiment. In the first embodiment, the second transmission line 22 (FIG. 1B) extends about one round counterclockwise along the loop 36 from the fifth end portion 22A. In contrast, in the second embodiment, the second transmission line 22 extends about two rounds counterclockwise along the loop 36 from the fifth end portion 22A. Thus, the number of turns T of the second transmission line 22 is twice as many as the number of turns T of the third transmission line 23. When calculating the number of turns T of the second transmission line 22, the method described above with reference to FIGS. 2A and 2B is applied, with the sixth end portion 22B, which is the outer end portion, being the origin point. Because the number of turns T of the second transmission line 22 is 2, the width of the second transmission line 22 is smaller than the width of each of the first transmission line 21 and the third transmission line 23.

Next, excellent effects of the second embodiment will be described.

In the second embodiment, the number of turns T of the second transmission line 22 is twice as many as the number of turns T of the third transmission line 23, and accordingly the impedance transformation ratio is increased to about 16. Also in the second embodiment, the first transmission line 21, the second transmission line 22, and the third transmission line 23 are disposed so as to overlap each other in plan view, which makes it possible to suppress an increase in the area occupied by the transmission line transformer 20 in the substrate 30. In this way, an impedance transformation circuit with a large impedance transformation ratio can be obtained while suppressing an increase in the size of the circuit.

Next, a transmission line transformer 20 according to a modification example of the second embodiment will be described with reference to FIG. 4.

Figure 4:
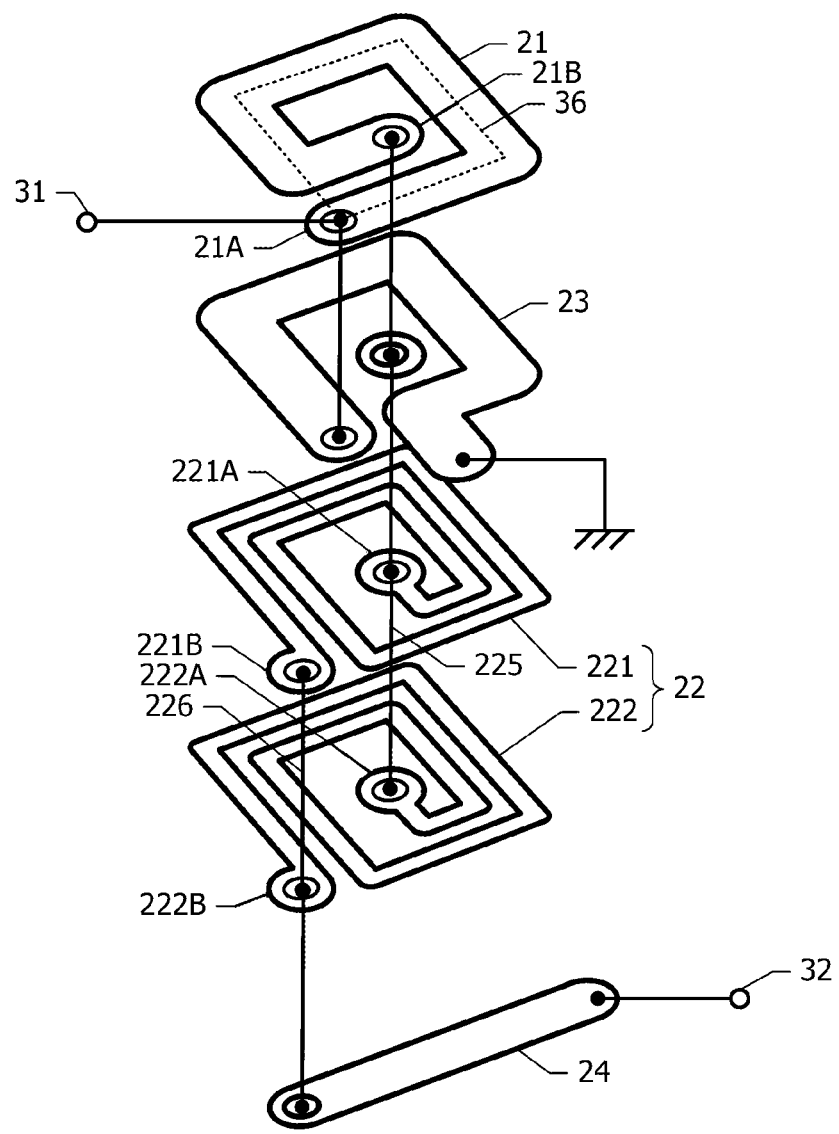
FIG. 4 is a schematic perspective view of a transmission line transformer according to a modification example of the second embodiment.

FIG. 4 is a schematic perspective view of the transmission line transformer 20 according to this modification example of the second embodiment. In this modification example, the second transmission line 22 is constituted by a set of two coil patterns 221 and 222. The coil patterns 221 and 222 each have the same shape as that of the second transmission line 22 according to the second embodiment (FIG. 3B) in plan view. The coil pattern 221 is disposed at the same position and in the same posture as those of the second transmission line 22 of the transmission line transformer 20 according to the second embodiment (FIG. 3B).

The coil pattern 222 is disposed across the coil pattern 221 from the third transmission line 23 in the thickness direction such that the coil pattern 222 overlaps the coil pattern 221 in plan view.

A via conductor 225 connects a fifth end portion 221A of the coil pattern 221 and a fifth end portion 222A of the coil pattern 222. A via conductor 226 connects a sixth end portion 221B of the coil pattern 221 and a sixth end portion 222B of the coil pattern 222. As described above, the second transmission line 22 is constituted by the two coil patterns 221 and 222 connected in parallel to each other.

In this modification example of the second embodiment, the parallel connection between the two coil patterns 221 and 222 suppresses an increase in the electrical resistance of the second transmission line 22. As a result, the insertion loss of the transmission line transformer 20 can be reduced.

Next, another modification example of the second embodiment will be described.

In the second embodiment, the number of turns T of the second transmission line 22 is twice as many as the number of turns T of the third transmission line 23, and accordingly the impedance transformation ratio is increased to about 16. To achieve an impedance transformation ratio of about 16 or more, the number of turns T of the second transmission line 22 may preferably be twice or more as many as the number of turns T of the third transmission line 23. Alternatively, the number of turns T of the first transmission line 21, instead of the second transmission line 22, may be twice or more as many as the number of turns T of the third transmission line 23. In this way, the number of turns T of at least one of the first transmission line 21 and the second transmission line 22 may preferably be twice or more as many as the number of turns T of the third transmission line 23.

Third Embodiment

A transmission line transformer 20 according to a third embodiment will be described with reference to FIGS. 5A and 5B. The same components as those of the transmission line transformer 20 according to the second embodiment (FIGS. 3A and 3B) will not be described.

Figure 5A:
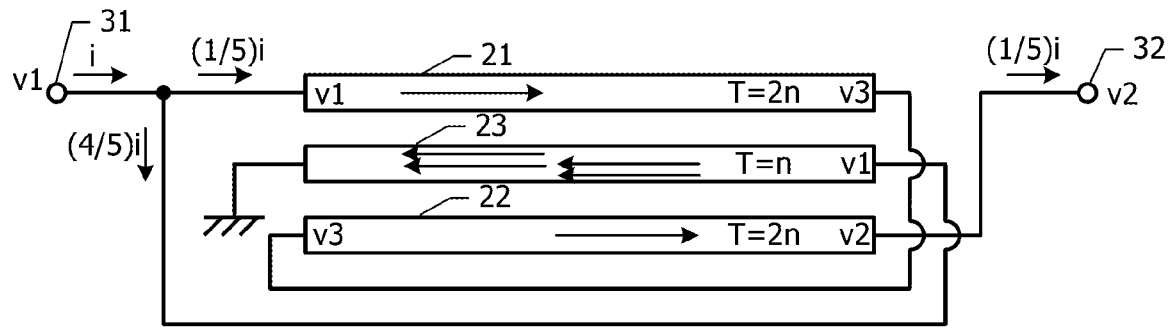
FIG. 5A is a schematic diagram for describing the operation principle of a transmission line transformer according to a third embodiment.

FIG. 5A is a schematic diagram for describing the operation principle of the transmission line transformer 20 according to the third embodiment. In the second embodiment, the first transmission line 21 and the third transmission line 23 have the same number of turns T. In the third embodiment, the number of turns T of the first transmission line 21 is 2n, whereas the number of turns T of the third transmission line 23 is n. That is, the number of turns T of the first transmission line 21 is twice as many as the number of turns T of the third transmission line 23.

In this case, the magnitude of the odd-mode current induced in the third transmission line 23 by the alternating current flowing through the first transmission line 21 is twice as much as the magnitude of the alternating current flowing through the first transmission line 21. The magnitude of the odd-mode current induced in the third transmission line 23 is four times as much as the magnitude of the alternating current flowing through the series circuit formed of the first transmission line 21 and the second transmission line 22. When the magnitude of the current flowing from the first terminal 31 into the transmission line transformer 20 is represented by i, the magnitude of the current flowing through the series circuit formed of the first transmission line 21 and the second transmission line 22 is represented by (⅕)i, and the magnitude of the current flowing through the third transmission line 23 is represented by (⅘)i. The magnitude of the current outputted from the second terminal 32 is represented by (⅕)i.

Regarding the voltages, 2(0−v1)=v1−v3 holds between the first transmission line 21 and the third transmission line 23. 2(0−v1)=v3−v2 holds between the second transmission line 22 and the third transmission line 23, as in the second embodiment. The solution of the simultaneous equations is v2=5×v1. That is, the voltage v2 at the second terminal 32 is five times as much as the voltage v1 at the first terminal 31.

The impedance seen on the load side from the first terminal 31 is ¹⁄₂₅ times as much as the impedance of the load connected to the second terminal 32. On the other hand, when a load is connected to the first terminal 31, the impedance seen on the load side from the second terminal 32 is 25 times as much as the impedance of the load connected to the first terminal 31. In this way, the transmission line transformer 20 according to the third embodiment functions as an impedance transformation circuit having an impedance transformation ratio of about 25.

Figure 5B:
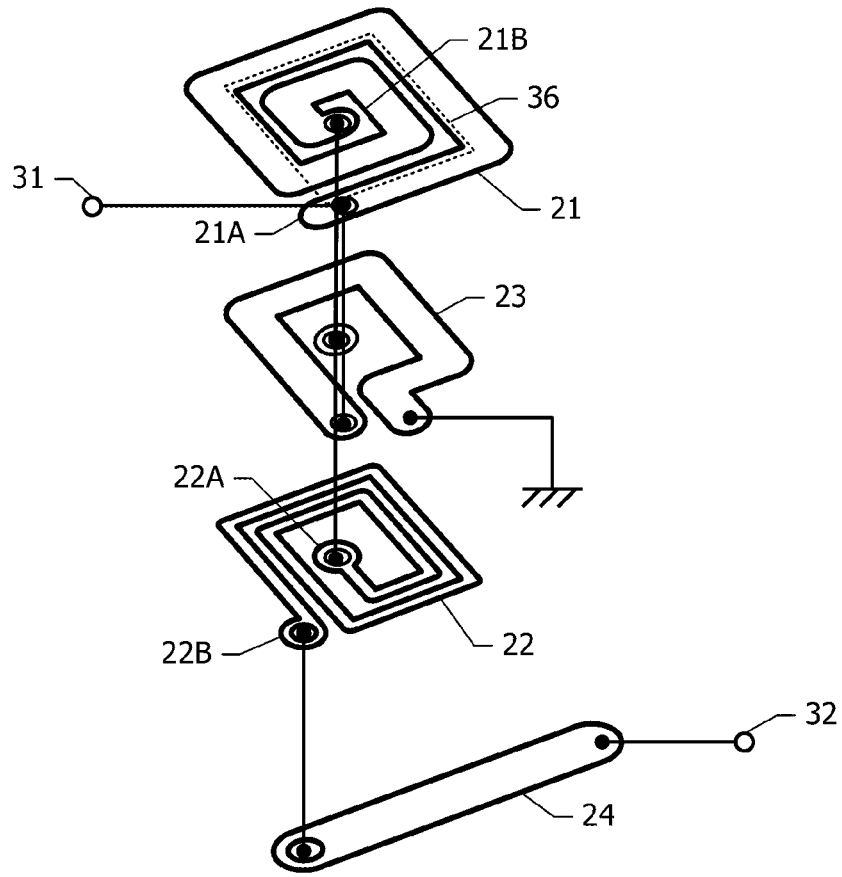
FIG. 5B is a schematic perspective view of the transmission line transformer according to the third embodiment.

FIG. 5B is a schematic perspective view of the transmission line transformer 20 according to the third embodiment. In the third embodiment, the first transmission line 21 extends about two rounds along the loop 36 from the third end portion 21A and reaches the fourth end portion 21B in plan view. In the first transmission line 21, the portion of the second round is disposed inside the portion of the first round. The first transmission line 21 has substantially the same width as that of the third transmission line 23. The center line of the portion of the first round of the first transmission line 21 is located outside the center line of the third transmission line 23, and the center line of the portion of the second round of the first transmission line 21 is located inside the center line of the third transmission line 23. With this arrangement, the first transmission line 21 has substantially the same width as that of the third transmission line 23, and has the number of turns T that is 2.

Next, excellent effects of the third embodiment will be described.

In the third embodiment, the number of turns T of not only the second transmission line 22 but also the first transmission line 21 is twice as many as the number of turns T of the third transmission line 23, and accordingly the impedance transformation ratio is increased to about 25. Also, in the third embodiment, the first transmission line 21, the second transmission line 22, and the third transmission line 23 are disposed so as to overlap each other in plan view, which makes it possible to suppress an increase in the area occupied by the transmission line transformer 20 in the substrate 30. In this way, an impedance transformation circuit with a large impedance transformation ratio can be obtained while suppressing an increase in the size of the circuit.

In the third embodiment, the first transmission line 21 has a larger width than the second transmission line 22. Thus, the first transmission line 21 has a smaller electrical resistance than the second transmission line 22. The impedance at the fifth end portion 22A of the second transmission line 22 is transformed by the transmission line transformer constituted by the first transmission line 21 and the third transmission line 23 and becomes larger than the impedance at the third end portion 21A of the first transmission line 21. Thus, actually, the magnitude (amplitude) of the current flowing through the series circuit formed of the first transmission line 21 and the second transmission line 22 gradually decreases from the third end portion 21A of the first transmission line 21 toward the sixth end portion 22B of the second transmission line 22. That is, the magnitude (amplitude) of the current flowing through the first transmission line 21 is larger than the magnitude (amplitude) of the current flowing through the second transmission line 22. By making the electrical resistance of the first transmission line 21, through which a relatively large current flows, lower than the electrical resistance of the second transmission line 22, through which a relatively small current flows, the loss resulting from the electrical resistance can be reduced.

Next, a transmission line transformer 20 according to a modification example of the third embodiment will be described with reference to FIG. 6.

Figure 6:
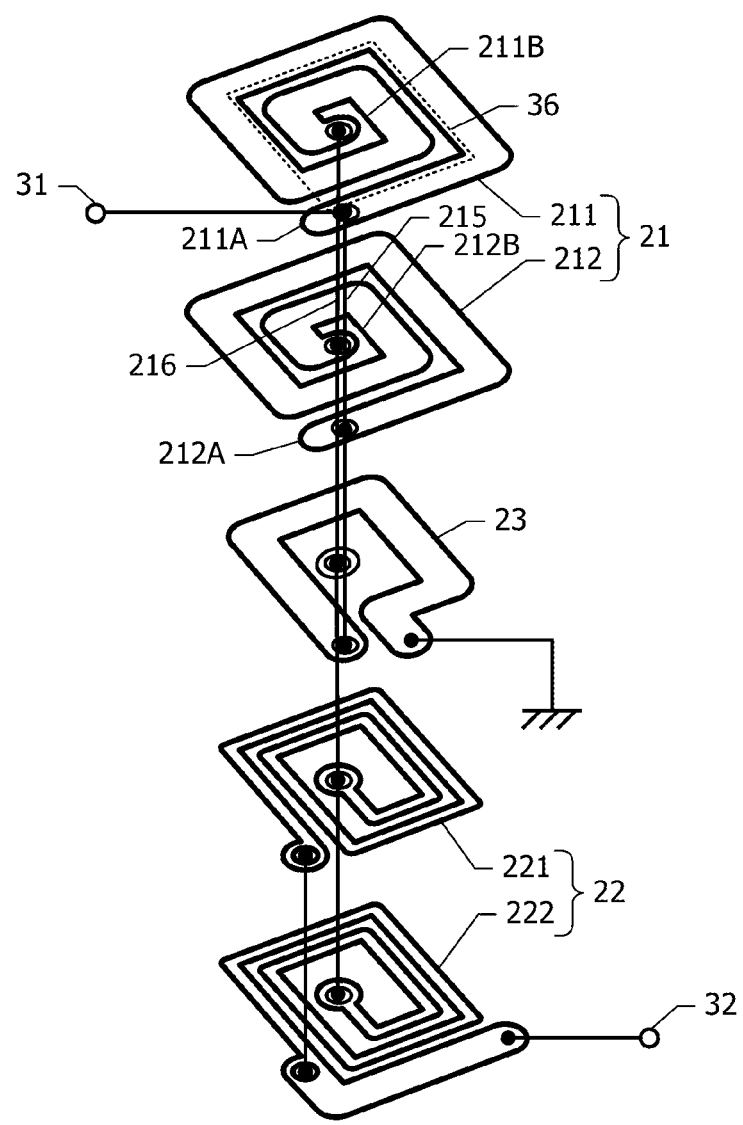
FIG. 6 is a schematic perspective view of a transmission line transformer according to a modification example of the third embodiment.

FIG. 6 is a schematic perspective view of the transmission line transformer 20 according to this modification example of the third embodiment. In this modification example, the first transmission line 21 is constituted by two coil patterns 211 and 212. The two coil patterns 211 and 212 are disposed at different positions in the thickness direction of the substrate 30 (FIG. 1C). In plan view, the coil patterns 211 and 212 each have the same shape as that of the first transmission line 21 according to the third embodiment (FIG. 5B) and are each disposed in the same posture as that of the first transmission line 21 according to the third embodiment.

The positional relationship between the coil pattern 212 and the third transmission line 23 is the same as the positional relationship between the first transmission line 21 and the third transmission line 23 according to the third embodiment (FIG. 5B). The coil pattern 211 is disposed across the coil pattern 212 from the third transmission line 23.

A via conductor 215 connects a third end portion 211A of the coil pattern 211 and a third end portion 212A of the coil pattern 212. A via conductor 216 connects a fourth end portion 211B of the coil pattern 211 and a fourth end portion 212B of the coil pattern 212. As described above, the first transmission line 21 is constituted by the two coil patterns 211 and 212 connected in parallel to each other.

The second transmission line 22 is constituted by the two coil patterns 221 and 222, like the second transmission line 22 of the transmission line transformer 20 according to the modification example of the second embodiment illustrated in FIG. 4.

Next, excellent effects of this modification example of the third embodiment will be described.

In this modification example of the third embodiment, the first transmission line 21 is constituted by the two coil patterns 211 and 212 connected in parallel to each other, and also the second transmission line 22 is constituted by the two coil patterns 221 and 222 connected in parallel to each other. Thus, the electrical resistances of the first transmission line 21 and the second transmission line 22 are decreased. As a result, the insertion loss of the transmission line transformer 20 can be reduced.

In this modification example, the two coil patterns 211 and 212 constituting the first transmission line 21 have a larger width than the two coil patterns 221 and 222 constituting the second transmission line 22. Thus, as in the third embodiment, the electrical resistance of the first transmission line 21, through which a relatively large current flows, is lower than the electrical resistance of the second transmission line 22, through which a relatively small current flows. As a result, the loss resulting from the electrical resistance can be reduced.

Next, another modification example of the third embodiment will be described.

In the third embodiment, the number of turns T of each of the first transmission line 21 and the second transmission line 22 is twice as many as the number of turns T of the third transmission line 23. Alternatively, the ratio of the number of turns T may be other than 2. By setting the number of turns T of each of the first transmission line 21 and the second transmission line 22 to be larger than or equal to the number of turns T of the third transmission line 23, an impedance transformation ratio of about 9 or more can be achieved.

Fourth Embodiment

An amplifying circuit according to a fourth embodiment will be described with reference to FIG. 7.

Figure 7:
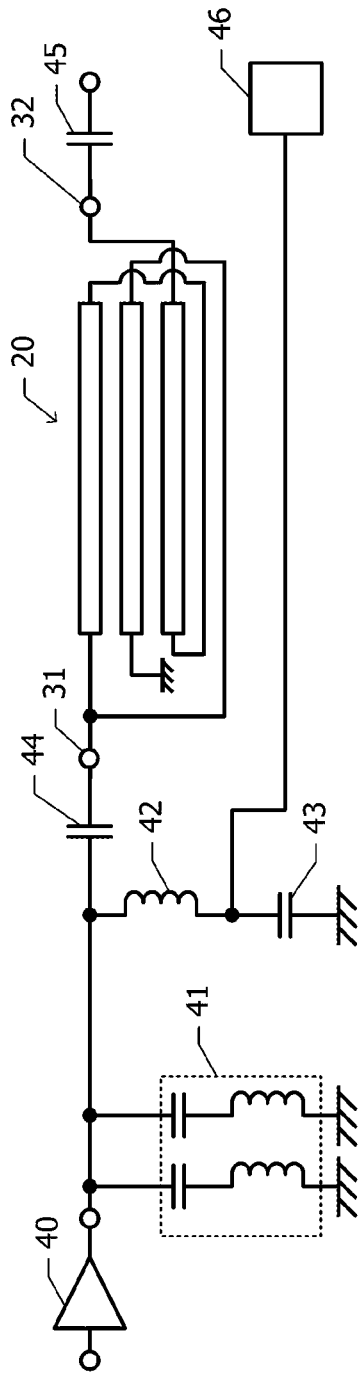
FIG. 7 is an equivalent circuit diagram of an amplifying circuit according to a fourth embodiment.

FIG. 7 is an equivalent circuit diagram of the amplifying circuit according to the fourth embodiment. The first terminal 31 of the transmission line transformer 20 is connected to an output terminal of an amplifying element 40 that amplifies a high-frequency signal, with a DC-cut capacitor 44 interposed therebetween. For example, a heterojunction bipolar transistor may be used as the amplifying element 40. The transmission line transformer 20 used here is the transmission line transformer 20 according to any one of the first to third embodiments and their modification examples. The high-frequency signal amplified by the amplifying element 40 is inputted to the transmission line transformer 20 through the DC-cut capacitor 44. The second terminal 32 of the transmission line transformer 20 is connected to a DC-cut capacitor 45, and the signal outputted from the second terminal 32 is supplied to a load through the DC-cut capacitor 45.

The output terminal of the amplifying element 40 is grounded through a harmonic termination circuit 41. The output terminal of the amplifying element 40 is also connected to a power supply circuit 46 with an inductor 42 interposed therebetween. DC power is supplied from the power supply circuit 46 to the amplifying element 40 through the inductor 42. The wiring line connecting the power supply circuit 46 and the inductor 42 is grounded through a decoupling capacitor 43.

Next, excellent effects of the fourth embodiment will be described.

In the fourth embodiment, the transmission line transformer 20 functions as an impedance matching circuit between the amplifying element 40 and the load. In the fourth embodiment, the impedance seen on the transmission line transformer 20 side from the output terminal of the amplifying element 40 is lower than the impedance seen on the load side from the second terminal 32. In the fourth embodiment, the transmission line transformer 20 according to any one of the first to third embodiments and their modification examples is used as the transmission line transformer 20. Thus, an impedance transformation ratio larger than that of a transmission line transformer according to the related art can be achieved, and the size of the impedance matching circuit can be reduced.

Fifth Embodiment

An amplifying circuit according a fifth embodiment will be described with reference to FIG. 8. The same components as those of the amplifying circuit according to the fourth embodiment (FIG. 7) will not be described.

Figure 8:
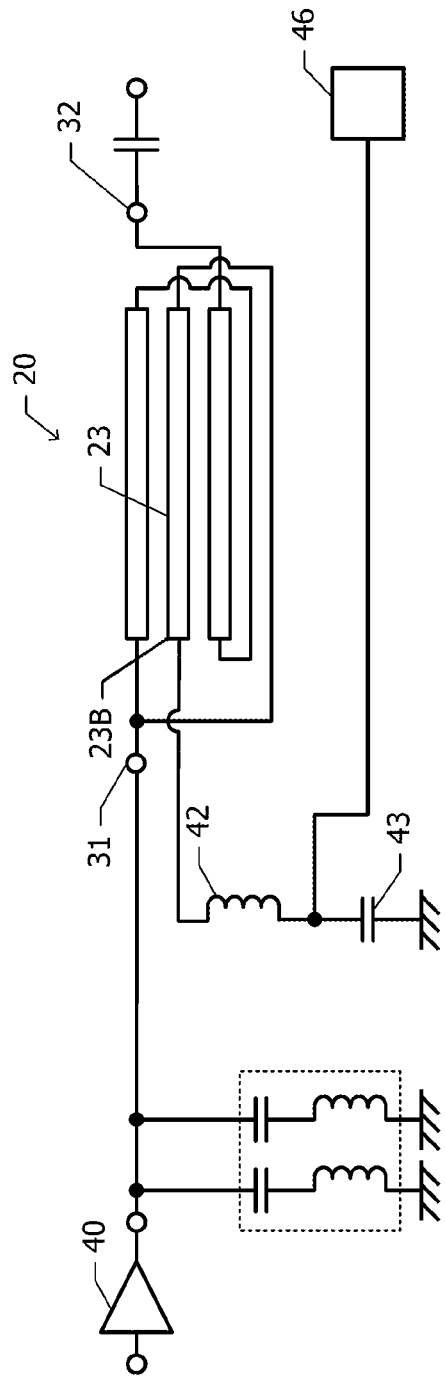
FIG. 8 is an equivalent circuit diagram of an amplifying circuit according to a fifth embodiment.

FIG. 8 is an equivalent circuit diagram of the amplifying circuit according to the fifth embodiment. In the fourth embodiment, the output terminal of the amplifying element 40 is connected to the first terminal 31 of the transmission line transformer 20 with the DC cut capacitor 44 (FIG. 7) interposed therebetween. In the fifth embodiment, the output terminal of the amplifying element 40 is directly connected to the first terminal 31 of the transmission line transformer 20. In the fourth embodiment, the output terminal of the amplifying element 40 is connected to the power supply circuit 46 with the inductor 42 (FIG. 7) interposed therebetween. In the fifth embodiment, the second end portion 23B of the third transmission line 23 of the transmission line transformer 20 is connected to the power supply circuit 46 with the inductor 42 interposed therebetween. DC power is supplied from the power supply circuit 46 to the amplifying element 40 through the inductor 42 and the third transmission line 23.

The power supply circuit 46 can be regarded as the ground in term of AC. Thus, the second end portion 23B of the third transmission line 23 is AC-grounded through the inductor 42. The third transmission line 23 also serves as a path for supplying DC power.

Next, excellent effects of the fifth embodiment will be described.

In the fifth embodiment, as in the fourth embodiment, an impedance transformation ratio larger than that of a transmission line transformer according to the related art can be achieved, and the size of the impedance matching circuit can be reduced. In the fifth embodiment, the DC-cut capacitor 44 according to the fourth embodiment (FIG. 7) is not necessary.

A modification example of the fifth embodiment will be described. In the fifth embodiment, the second end portion 23B of the third transmission line 23 is connected to the power supply circuit 46 with the inductor 42 interposed therebetween. When the third transmission line 23 has a sufficient inductance, the inductor 42 is not necessary, and the second end portion 23B of the third transmission line 23 may be directly connected to the power supply circuit 46.

Sixth Embodiment

An amplifying circuit according to a sixth embodiment will be described with reference to FIG. 9. In the fourth embodiment (FIG. 7) and the fifth embodiment (FIG. 8), the transmission line transformer 20 is connected to the output terminal of the amplifying element 40. In the sixth embodiment, the transmission line transformer 20 is connected to an input terminal of the amplifying element 40. The transmission line transformer 20 used here is the transmission line transformer 20 according to any one of the first to third embodiments and their modification examples.

Figure 9:
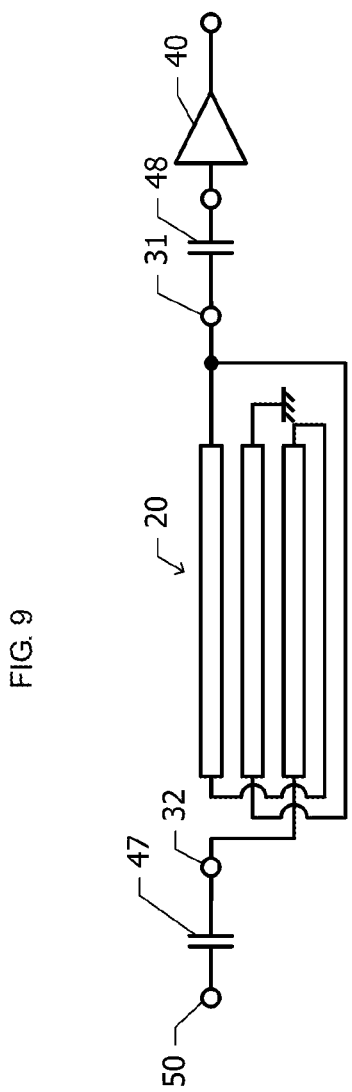
FIG. 9 is an equivalent circuit diagram of an amplifying circuit according to a sixth embodiment.

FIG. 9 is an equivalent circuit diagram of the amplifying circuit according to the sixth embodiment. A high-frequency signal is inputted from a high-frequency signal input terminal 50 to the second terminal 32 of the transmission line transformer 20 through a DC-cut capacitor 47. The first terminal 31 of the transmission line transformer 20 is connected to the input terminal of the amplifying element 40 with a DC-cut capacitor 48 interposed therebetween. The transmission line transformer 20 functions as an impedance matching circuit on the input side of the amplifying element 40. In the sixth embodiment, the impedance seen on the transmission line transformer 20 side from the high-frequency signal input terminal 50 is higher than the impedance seen on the amplifying element 40 side from the first terminal 31. In this way, impedance transformation for decreasing the impedance is performed in the sixth embodiment.

Next, excellent effects of the sixth embodiment will be described.

In the sixth embodiment, as in the fourth and fifth embodiments, an impedance transformation ratio larger than that of a transmission line transformer according to the related art can be achieved, and the size of the impedance matching circuit can be reduced.

Seventh Embodiment

An amplifying circuit according to a seventh embodiment will be described with reference to FIG. 10. In the seventh embodiment, amplifying elements 40 are connected in multiple stages to form a multi-stage power amplifying circuit.

Figure 10:
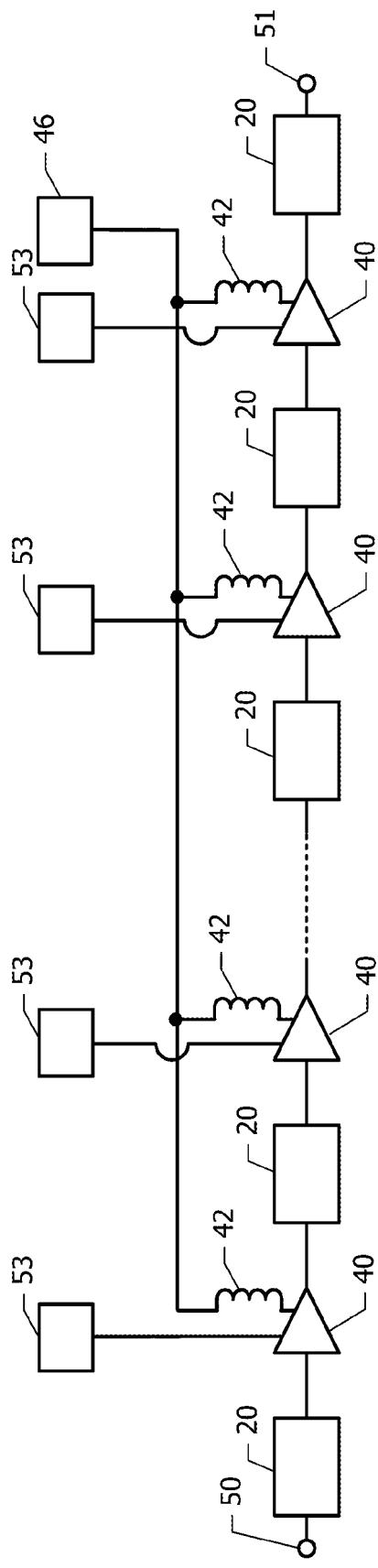
FIG. 10 is a block diagram of an amplifying circuit according to a seventh embodiment.

FIG. 10 is a block diagram of the amplifying circuit according to the seventh embodiment. A plurality of amplifying elements 40 are connected in multiple stages between the high-frequency signal input terminal 50 and a high-frequency signal output terminal 51 from which an amplified high-frequency signal is outputted. An input-side transmission line transformer 20 is disposed between the high-frequency signal input terminal 50 and a first-stage amplifying element 40. An output-side transmission line transformer 20 is disposed between a last-stage amplifying element 40 and the high-frequency signal output terminal 51. An interstage transmission line transformer 20 is disposed between one amplifying element 40 and the subsequent amplifying element 40. As each of the input-side transmission line transformer 20, the output-side transmission line transformer 20, and the interstage transmission line transformer 20, the transmission line transformer 20 according to any one of the first to third embodiments and their modification examples is used.

DC power is supplied to the plurality of amplifying elements 40 from the power supply circuit 46 through the inductors 42. DC bias is supplied to the plurality of amplifying elements 40 from bias control circuits 53.

Next, excellent effects of the seventh embodiment will be described.

In the seventh embodiment, the transmission line transformers 20 function as input-side, interstage, and output-side impedance matching circuits. In the seventh embodiment, the sizes of the impedance matching circuits can be reduced as in the fourth embodiment (FIG. 7), the fifth embodiment (FIG. 8), and the sixth embodiment (FIG. 9).

A modification example of the seventh embodiment will be described.

In the seventh embodiment, the transmission line transformer 20 according to any one of the first to third embodiments and their modification examples is used as each of the input-side, output-side, and interstage impedance matching circuits. At a part where a large impedance transformation ratio is not necessary, the transmission line transformer 20 according to any one of the first to third embodiments and their modification examples is not necessary. For example, a transmission line transformer that does not include the second transmission line 22 in FIG. 1A but includes the first transmission line 21 and the third transmission line 23 in FIG. 1A may be used as an impedance matching circuit. Alternatively, a ladder impedance matching circuit formed of a capacitance and an inductance may be used. For example, the transmission line transformer 20 according to any one of the first to third embodiments and their modification examples may be used as at least one of the input-side, output-side, and interstage impedance matching circuits.

Eighth Embodiment

Simulation results of input/output impedances of impedance transformation circuits according to an eighth embodiment will be described with reference to FIGS. 11A to 13B.

Figure 11A:
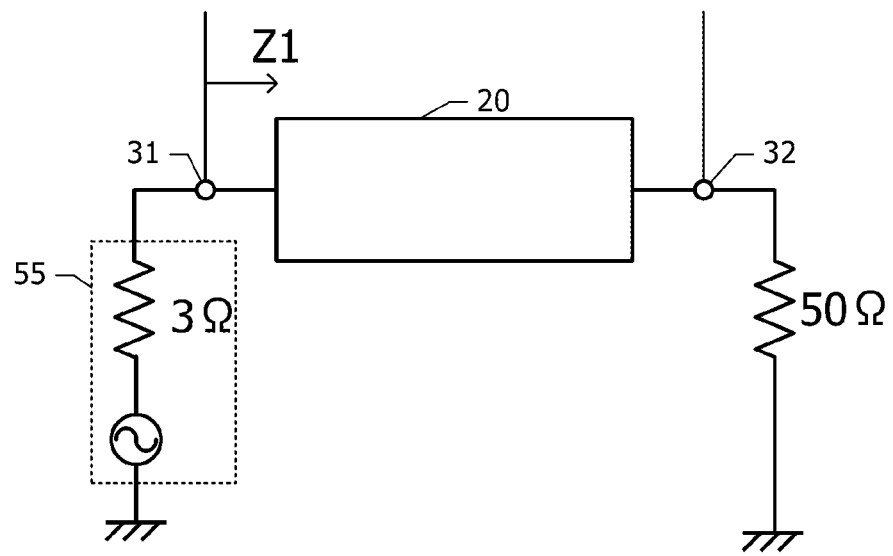
FIGS. 11A and 11B are block diagrams of impedance transformation circuits according to an eighth embodiment as simulation targets.
Figure 11B:
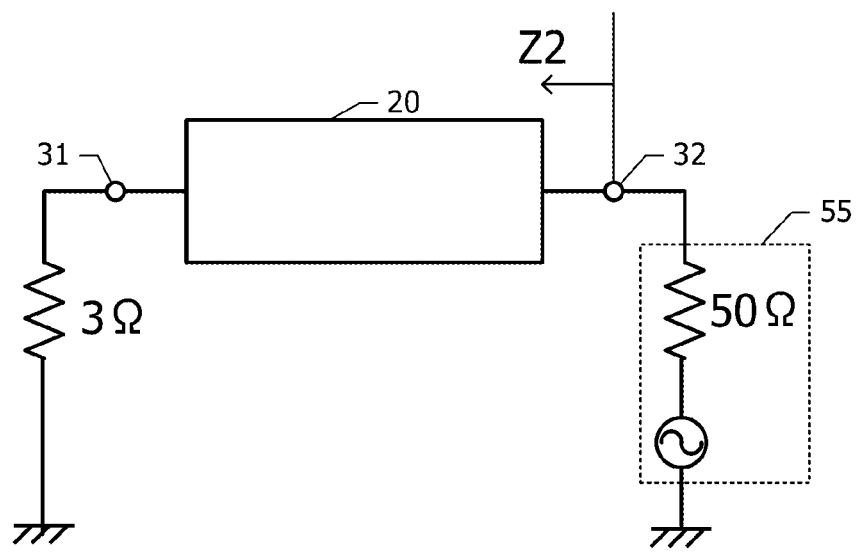

FIGS. 11A and 11B are block diagrams of the impedance transformation circuits according to the eighth embodiment as simulation targets. As the impedance transformation circuits, the transmission line transformer 20 according to the second embodiment (FIGS. 3A and 3B) having an impedance transformation ratio of about 16 is used.

In the impedance transformation circuit illustrated in FIG. 11A, an AC power supply 55 having an output impedance of about 3Ω is connected to the first terminal 31 of the transmission line transformer 20, and the second terminal 32 is terminated with about 50Ω. In the impedance transformation circuit illustrated in FIG. 11B, the AC power supply 55 having an output impedance of about 50Ω is connected to the second terminal 32 of the transmission line transformer 20, and the first terminal 31 was terminated with about 3Ω.

In the impedance transformation circuit illustrated in FIG. 11A, the impedance seen on the transmission line transformer 20 side from the first terminal 31 is represented by Z1. In the impedance transformation circuit illustrated in FIG. 11B, the impedance seen on the transmission line transformer 20 side from the second terminal 32 is represented by Z2. An electromagnetic-field simulation is performed with the frequency being changed from about 100 MHz to about 20 GHz, thereby obtaining the impedances Z1 and Z2. The transmission line transformer 20 is designed to achieve an impedance transformation ratio of about 16 in the frequency band ranging from about 2.3 GHz to about 2.69 GHz.

Figure 12A:
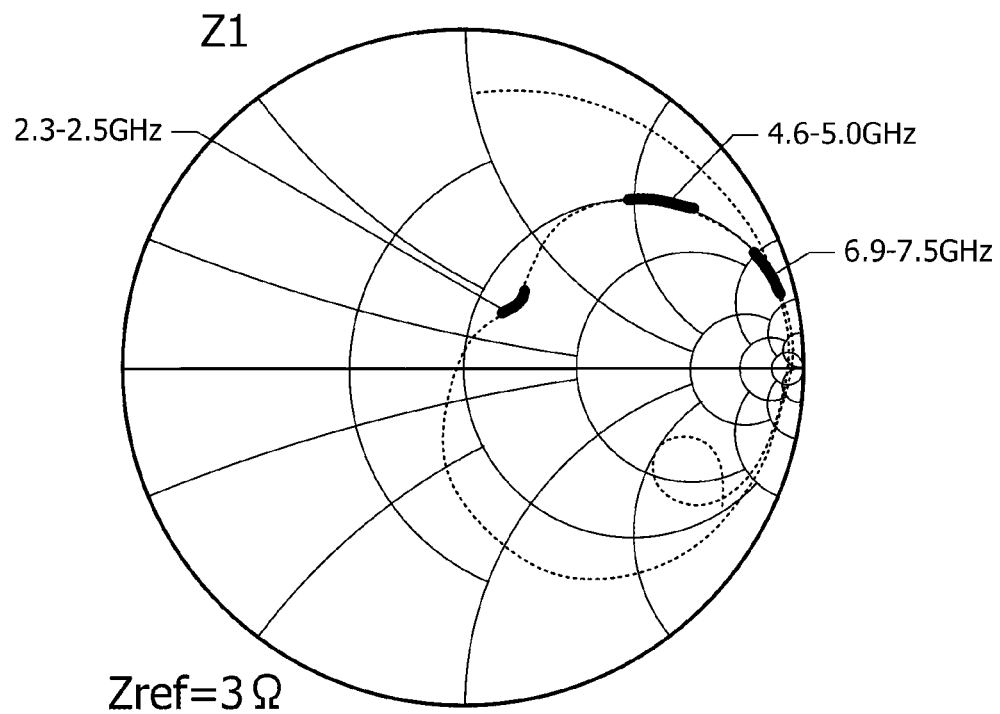
FIGS. 12A and 12B are graphs obtained by plotting the trajectories of impedances (FIGS. 11A and 11B) at various frequencies on Smith charts.

FIG. 12A is a graph obtained by plotting the trajectory of the impedance Z1 at various frequencies on a Smith chart. A reference impedance Zref at the reference point (center point) of the Smith chart is about 3Ω. The impedance Z1 in the frequency band ranging from about 2.3 GHz to about 2.69 GHz, the impedance Z1 in the frequency band of the second harmonic (ranging from about 4.6 GHz to about 5.38 GHz), and the impedance Z1 in the frequency band of the third harmonic (ranging from about 6.9 GHz to about 8.07 GHz) are represented by the bold lines. It can be seen that the impedance Z1 is near the reference point of the Smith chart and is approximately 3Ω in the frequency band ranging from about 2.3 GHz to about 2.69 GHz. As a result, it is confirmed that the impedance is transformed from about 50Ω to about ¹⁄₁₆, that is, about 3Ω.

Figure 12B:
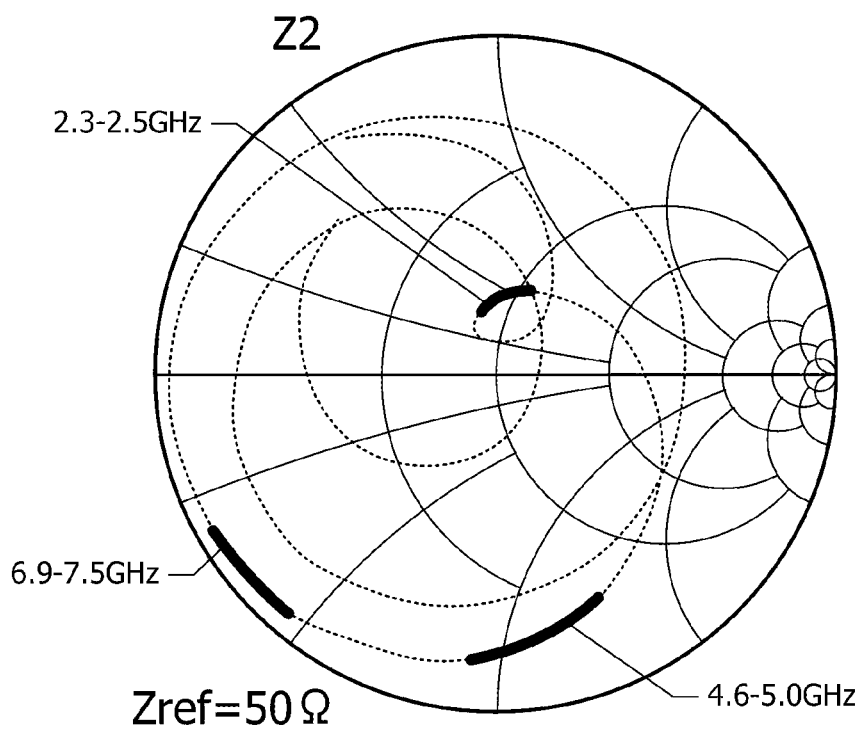

FIG. 12B is a graph obtained by plotting the trajectory of the impedance Z2 at various frequencies on a Smith chart. A reference impedance Zref at the reference point (center point) of the Smith chart is about 50Ω. The impedance Z2 in the frequency band ranging from about 2.3 GHz to about 2.69 GHz, the impedance Z2 in the frequency band of the second harmonic (ranging from about 4.6 GHz to about 5.38 GHz), and the impedance Z2 in the frequency band of the third harmonic (ranging from about 6.9 GHz to about 8.07 GHz) are represented by bold lines. It can be seen that the impedance Z2 is near the reference point of the Smith chart and is approximately 50Ω in the frequency band ranging from about 2.3 GHz to about 2.69 GHz. As a result, it is confirmed that the impedance is transformed from about 3Ω to about 16 times, that is, about 50Ω.

Figure 13A:
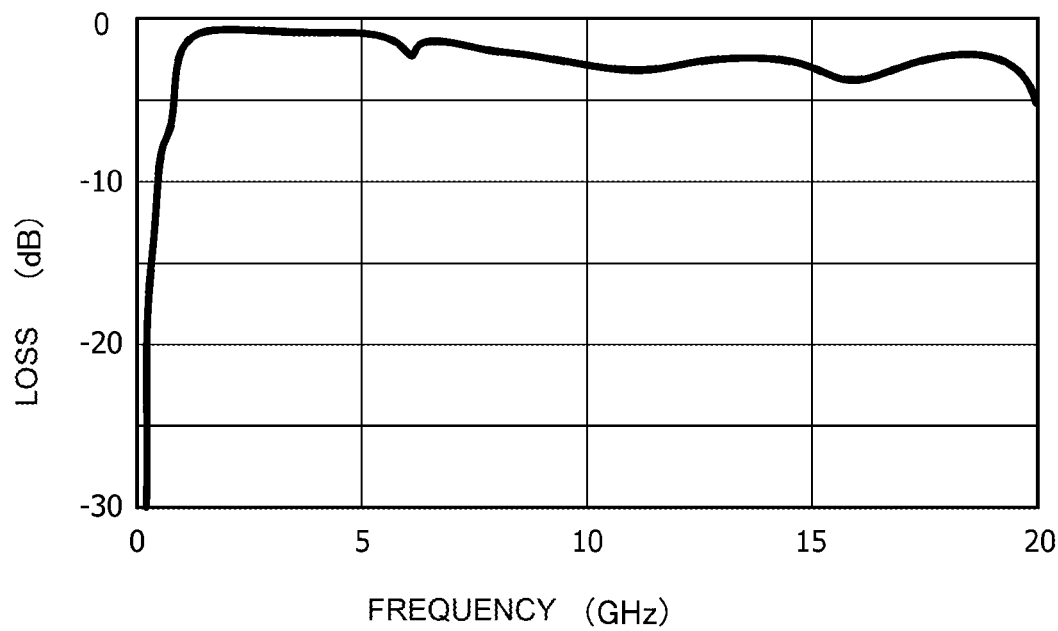
FIGS. 13A and 13B are graphs illustrating simulation results of insertion loss of a transmission line transformer.
Figure 13B:
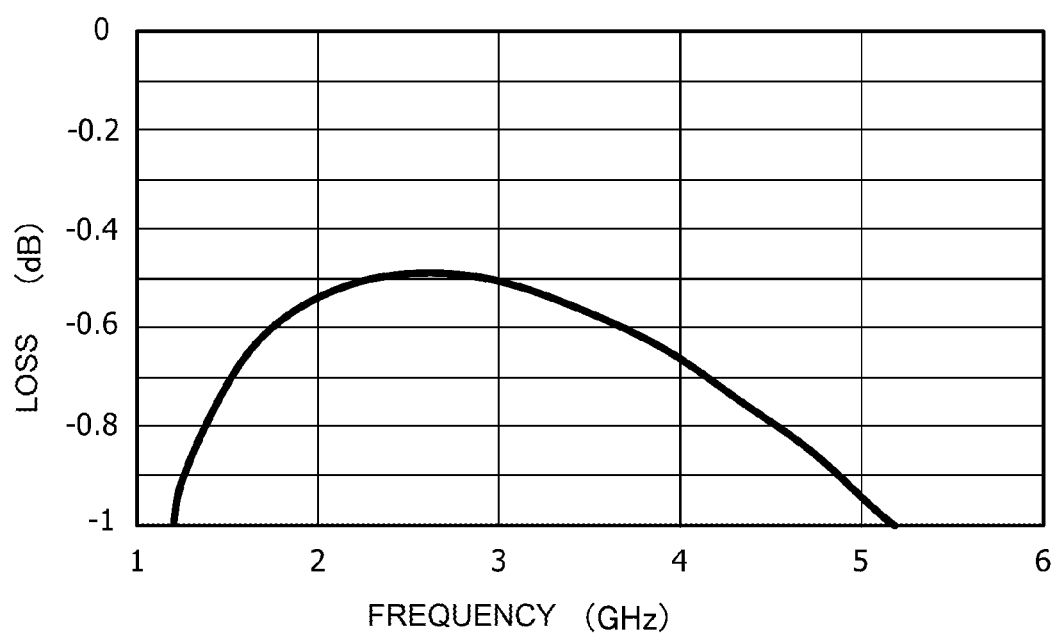

FIGS. 13A and 13B are graphs illustrating simulation results of insertion loss of the transmission line transformer 20. The horizontal axis represents frequency in "GHz", and the vertical axis represents insertion loss in "dB". An insertion loss IL is defined by the following equation.

$$IL = 10\log\frac{|S_{21}|^2}{1-|S_{11}|^2}$$

Here, $S_{11}$ and $S_{21}$ are scattering parameters. A smaller absolute value on the vertical axis represents a smaller loss. FIG. 13B is an enlarged view of the range of frequencies 1 GHz to 6 GHz on the horizontal axis of FIG. 13A. It can be seen that the insertion loss is small in the frequency band ranging from about 2.3 GHz to about 2.69 GHz.

From the simulations in the eighth embodiment, it is confirmed that an impedance matching circuit having an impedance transformation ratio of about 16 can be obtained by using the transmission line transformer 20 according to the second embodiment. Also, it is confirmed that an impedance matching circuit with low insertion loss can be obtained by using the transmission line transformer 20 according to the second embodiment. These simulation results also show that an impedance matching circuit with low insertion loss can be obtained by using the transmission line transformer 20 according to the first embodiment or the third embodiment.

Ninth Embodiment

Simulation results of input/output impedances of impedance transformation circuits according to a ninth embodiment will be described with reference to FIGS. 14A to 16B.

Figure 14A:
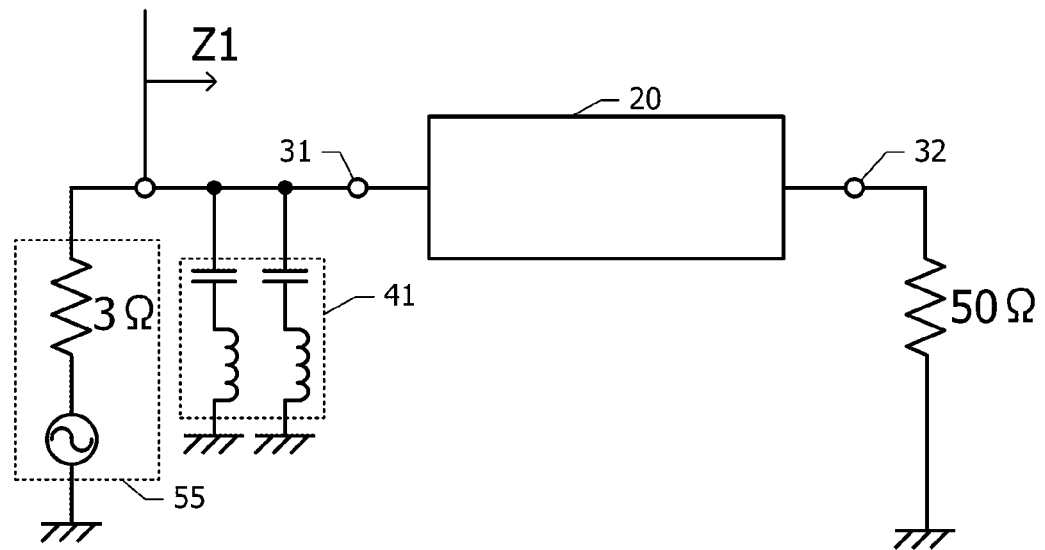
FIGS. 14A and 14B are block diagrams of impedance transformation circuits according to a ninth embodiment as simulation targets.
Figure 14B:
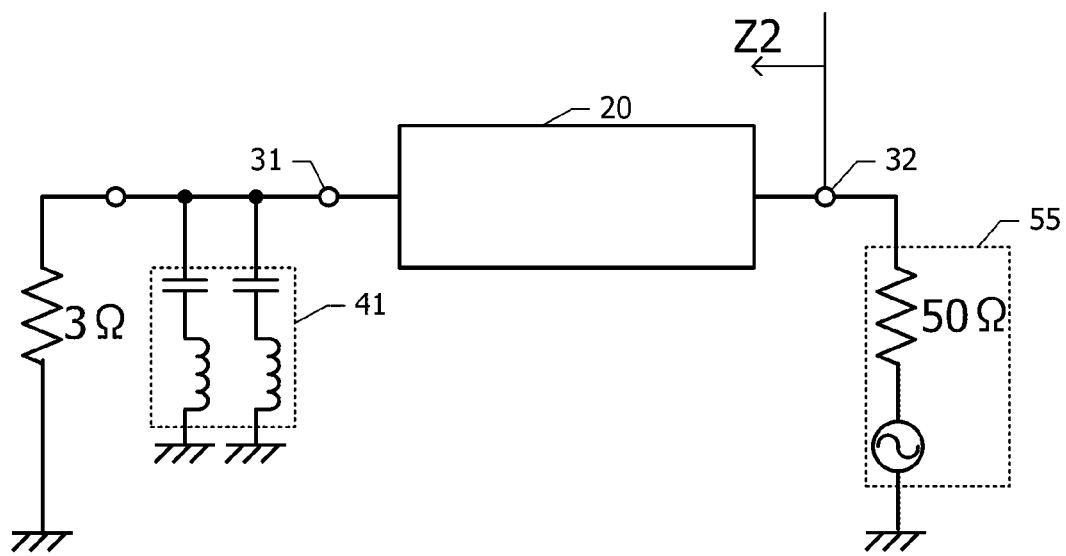

FIGS. 14A and 14B are block diagrams of the impedance transformation circuits as simulation targets. The impedance transformation circuit illustrated in FIG. 14A is formed by connecting the harmonic termination circuit 41 between the AC power supply 55 and the transmission line transformer 20 illustrated in FIG. 11A. The impedance transformation circuit illustrated in FIG. 14B is formed by connecting the harmonic termination circuit 41 between the load and the transmission line transformer 20 illustrated in FIG. 11B.

In FIG. 14A, the impedance seen on the harmonic termination circuit 41 and the transmission line transformer 20 side from the AC power supply 55 is represented by Z1. In FIG. 14B, the impedance seen on the harmonic termination circuit 41 and the transmission line transformer 20 side from the AC power supply 55 is represented by Z2. An electromagnetic-field simulation is performed with the frequency being changed from about 100 MHz to about 20 GHz, thereby obtaining the impedances Z1 and Z2.

Figure 15A:
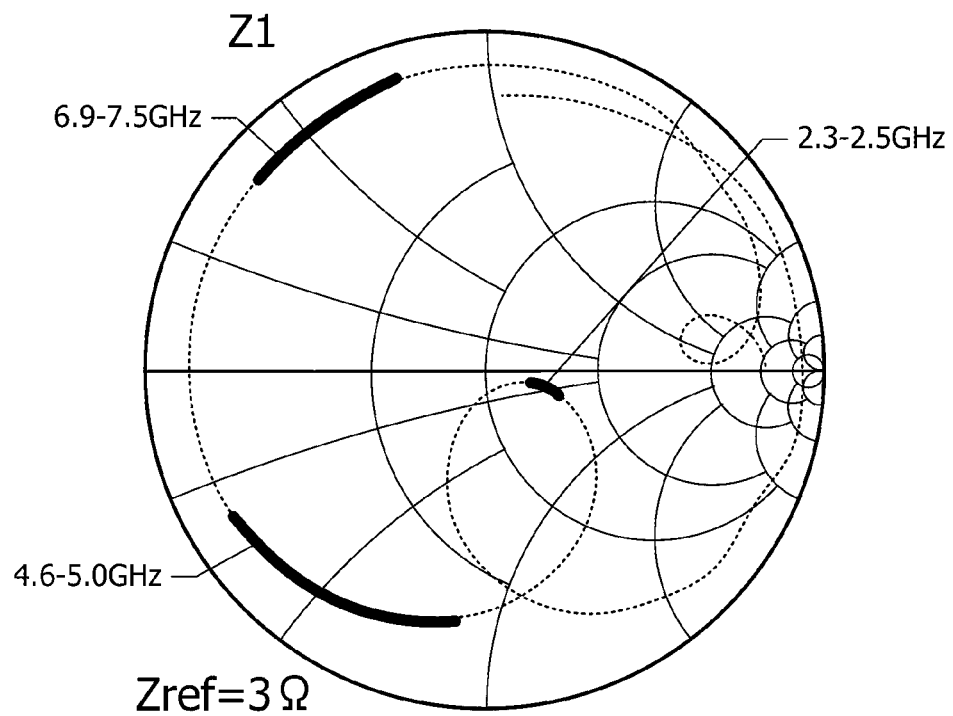
FIGS. 15A and 15B are graphs obtained by plotting the trajectories of impedances (FIGS. 14A and 14B) at various frequencies on Smith charts.

FIG. 15A is a graph obtained by plotting the trajectory of the impedance Z1 at various frequencies on a Smith chart. A reference impedance Zref at the reference point (center point) of the Smith chart is about 3Ω. The impedance Z1 in the frequency band ranging from about 2.3 GHz to about 2.69 GHz, the impedance Z1 in the frequency band of the second harmonic (ranging from about 4.6 GHz to about 5.38 GHz), and the impedance Z1 in the frequency band of the third harmonic (ranging from about 6.9 GHz to about 8.07 GHz) are represented by bold lines. As in the eighth embodiment (FIG. 12A), it can be seen that the impedance Z1 is near the reference point of the Smith chart and is approximately 3Ω in the frequency band ranging from about 2.3 GHz to about 2.69 GHz. As a result, it is confirmed that the impedance is transformed from about 50Ω to about 1/16, that is, about 3Ω.

Figure 15B:
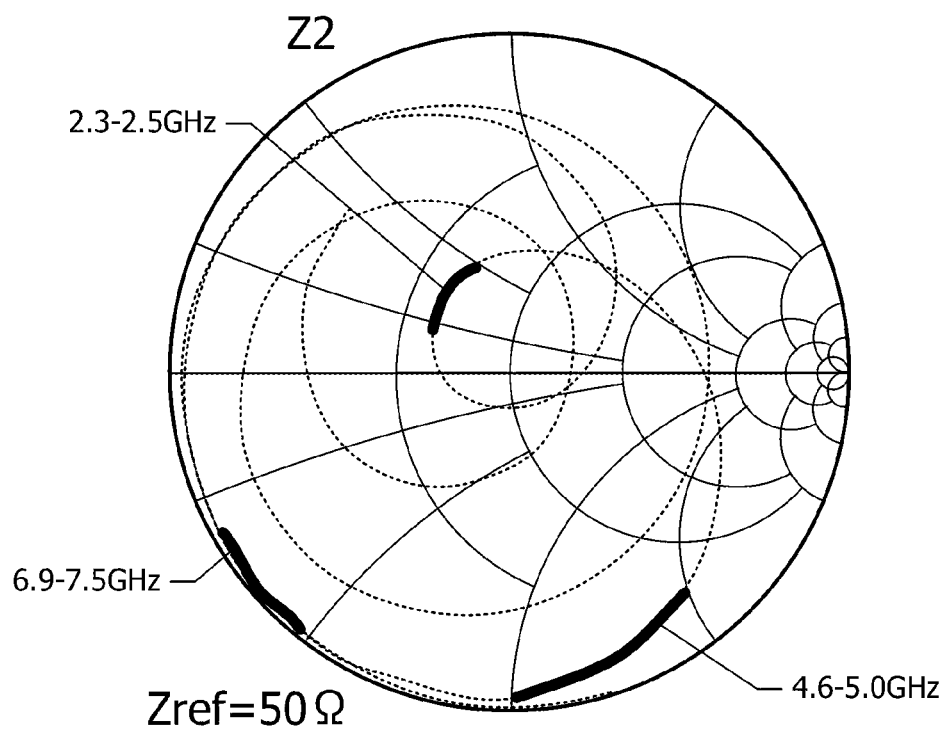

FIG. 15B is a graph obtained by plotting the trajectory of the impedance Z2 at various frequencies on a Smith chart. A reference impedance Zref at the reference point (center point) of the Smith chart is about 50Ω. The impedance Z2 in the frequency band ranging from about 2.3 GHz to about 2.69 GHz, the impedance Z2 in the frequency band of the second harmonic (ranging from about 4.6 GHz to about 5.38 GHz), and the impedance Z2 in the frequency band of the third harmonic (ranging from about 6.9 GHz to about 8.07 GHz) are represented by bold lines. It can be seen that the impedance Z2 is near the reference point of the Smith chart and is approximately 50Ω in the frequency band ranging from about 2.3 GHz to about 2.69 GHz. As a result, it is confirmed that the impedance is transformed from about 3Ω to about 16 times, that is, about 50Ω.

Figure 16A:
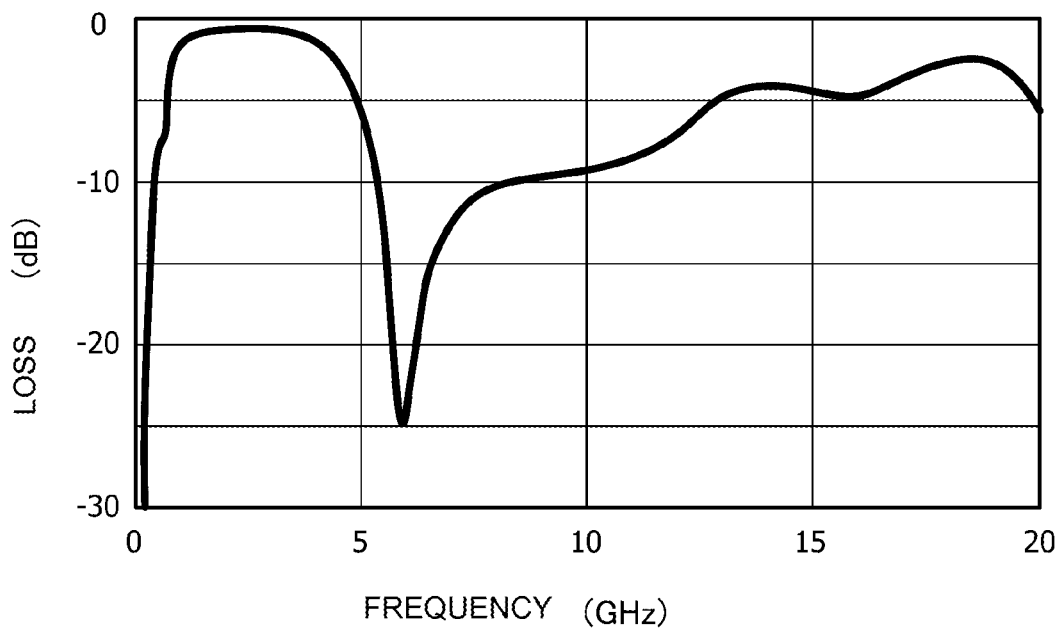
FIGS. 16A and 16B are graphs illustrating simulation results of insertion loss of a transmission line transformer.
Figure 16B:
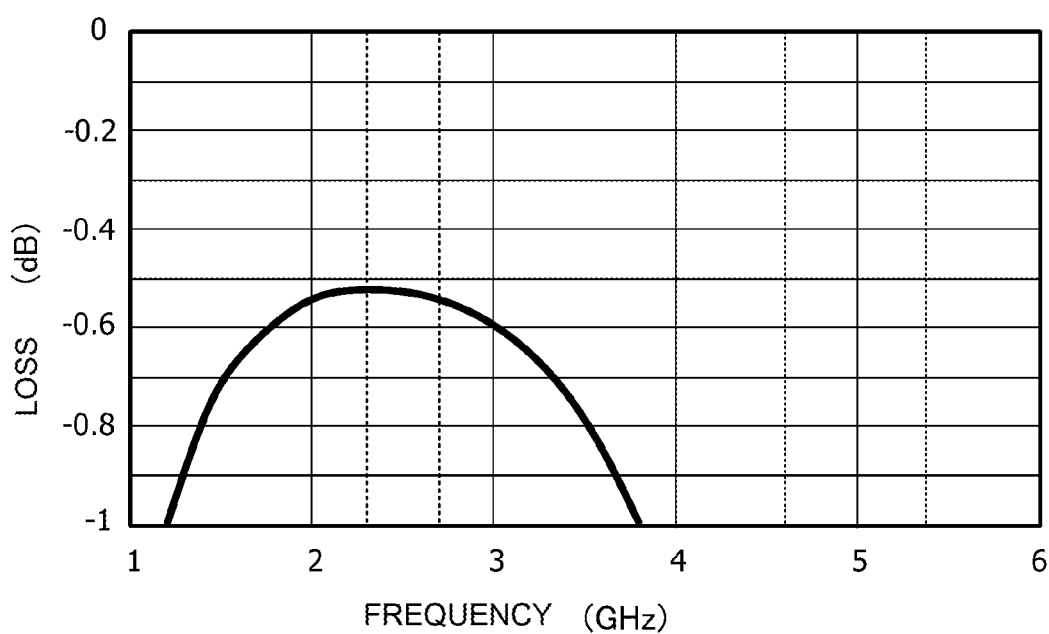

FIGS. 16A and 16B are graphs illustrating simulation results of insertion loss of the transmission line transformer 20. The horizontal axis represents frequency in "GHz", and the vertical axis represents insertion loss in "dB". A smaller absolute value on the vertical axis represents a smaller loss. FIG. 16B is an enlarged view of the range of frequencies 1 GHz to 6 GHz on the horizontal axis of FIG. 16A. It can be seen that the insertion loss is small in the frequency band ranging from about 2.3 GHz to about 2.69 GHz.

From the simulations in the ninth embodiment, it is confirmed that an impedance matching circuit with low insertion loss can be obtained by using the transmission line transformer 20 according to the second embodiment, also in the configuration including the harmonic termination circuit 41. The comparison between FIG. 12A and FIG. 15A shows that the harmonic termination circuit 41 causes a decrease in the impedance Z1 for the second harmonic and the third harmonic. Thus, the transmission line transformer 20 according to the second embodiment, which is a simulation target, can be used also as an output matching circuit for realizing the operation of a switching mode power amplifier. Accordingly, the power-added efficiency of the switching mode power amplifier is improved.

In addition, it can be easily understood, from these simulation results, that an impedance matching circuit with low insertion loss can be obtained by using the transmission line transformer 20 according to the first embodiment or the third embodiment.

Tenth Embodiment

An amplifying circuit according to a tenth embodiment will be described with reference to FIGS. 17, 18, and 19. The same components as those of the amplifying circuit according to the fourth embodiment (FIG. 7) will not be described.

Figure 17:
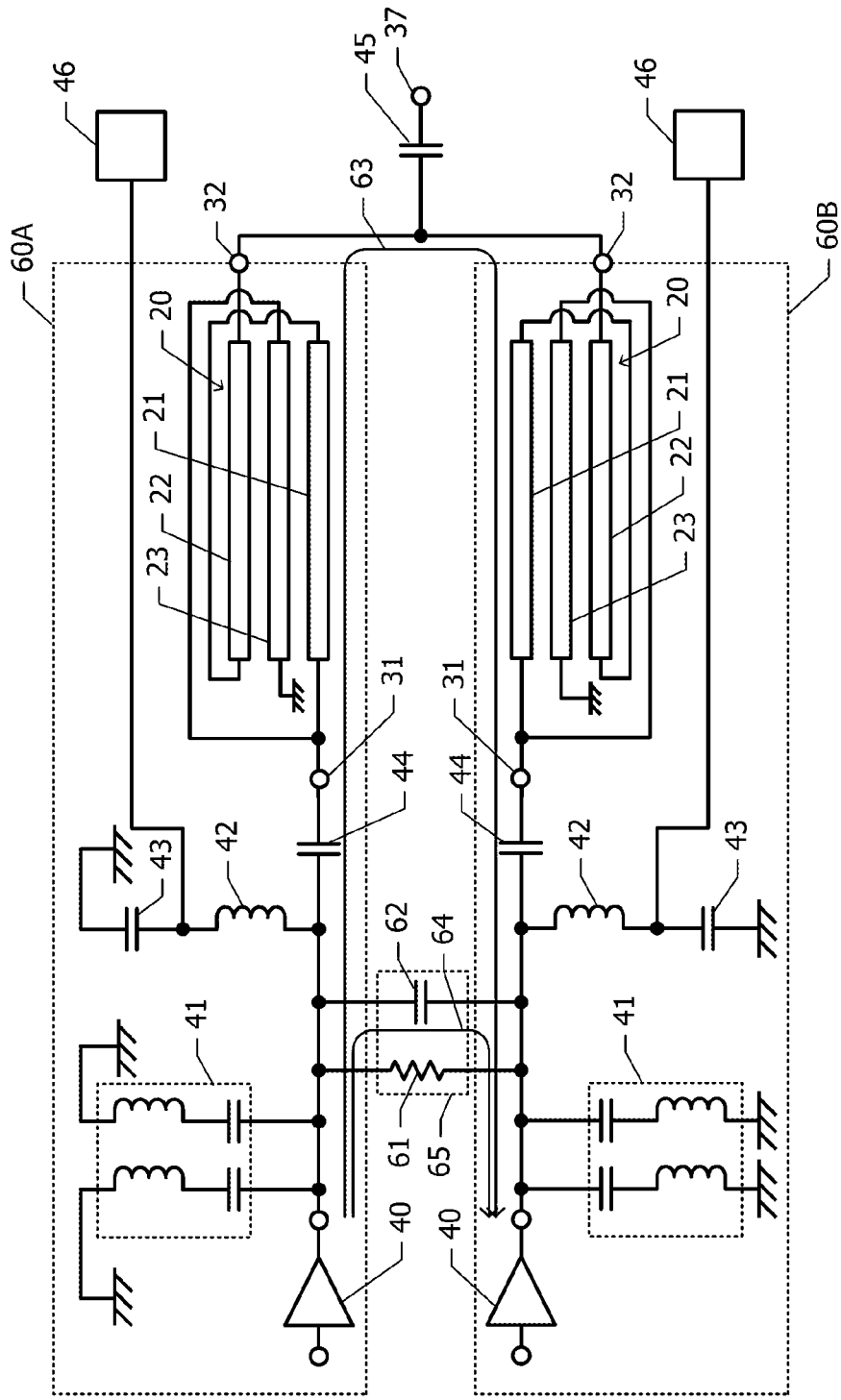
FIG. 17 is an equivalent circuit diagram of an amplifying circuit according to a tenth embodiment.

FIG. 17 is an equivalent circuit diagram of the amplifying circuit according to the tenth embodiment. The amplifying circuit according to the tenth embodiment includes two amplifying systems 60A and 60B. The two amplifying systems 60A and 60B each include the amplifying element 40 and the transmission line transformer 20. In each of the two amplifying systems 60A and 60B, the configuration from the amplifying element 40 to the second terminal 32 is the same as the configuration from the amplifying element 40 to the second terminal 32 of the amplifying circuit according to the fourth embodiment (FIG. 7). The second terminals 32 of the two amplifying systems 60A and 60B are connected to each other and are connected to one electrode of the single DC-cut capacitor 45. The other electrode of the DC-cut capacitor 45 is connected to an output terminal 37. A resistance element 61 and a capacitor 62 are connected in parallel to each other between the output terminal of the amplifying element 40 of the amplifying system 60A and the output terminal of the amplifying element 40 of the amplifying system 60B. A connection circuit formed of the resistance element 61 and the capacitor 62 is referred to as an inter-system phase-shift circuit 65.

The operation of the amplifying circuit according to the tenth embodiment will be described. The amplifying circuit according to the tenth embodiment constitutes a Webb's power combiner.

High-frequency signals having substantially the same phase and substantially the same amplitude are inputted to the two amplifying elements 40. The two amplifying elements 40 amplify the input high-frequency signals and output high-frequency signals having substantially the same phase and substantially the same amplitude. The high-frequency signals amplified by the two amplifying elements 40 are subjected to impedance transformation performed by the two transmission line transformers 20 and are then outputted from the second terminals 32. The high-frequency signals outputted from the second terminals 32 are combined before the DC-cut capacitor 45 and the resulting signal is outputted from the output terminal 37.

The function of the inter-system phase-shift circuit 65 that connects the two amplifying systems 60A and 60B will be described. A current path extending from the output terminal of the amplifying element 40 of the amplifying system 60A to the output terminal of the amplifying element 40 of the amplifying system 60B includes a first signal path 63 passing through the transmission line transformers 20 and a second signal path 64 passing through the inter-system phase-shift circuit 65. The first signal path 63 and the second signal path 64 are configured such that the difference between the amount of phase change in the high-frequency signal transmitted through the first signal path 63 and the amount of phase change in the high-frequency signal transmitted through the second signal path 64 from the output terminal of the amplifying element 40 of the amplifying system 60A to the output terminal of the amplifying element 40 of the amplifying system 60B is about 180 degrees. For example, the amount of phase change in the case of passing through the first signal path 63 is about +90 degrees, whereas the amount of phase change in the case of passing through the second signal path 64 is about −90 degrees.

The two high-frequency signals that are outputted from the amplifying element 40 of the amplifying system 60B, that are transmitted through the first signal path 63 and the second signal path 64, and that reach the output terminal of the amplifying element 40 of the amplifying system 60B have a phase difference of about 180 degrees, and thus power offset occurs. That is, the high-frequency signal outputted from the amplifying element 40 of the amplifying system 60A hardly appears at the output terminal of the amplifying element 40 of the amplifying system 60B. Similarly, the high-frequency signal outputted from the amplifying element 40 of the amplifying system 60B hardly appears at the output terminal of the amplifying element 40 of the amplifying system 60A. Thus, high-frequency isolation is secured between the output terminals of the two amplifying elements 40 of the two amplifying systems 60A and 60B. As a result, almost all the power of the high-frequency signals outputted from the two amplifying elements 40 can be transmitted to the output terminal 37.

Figure 18:
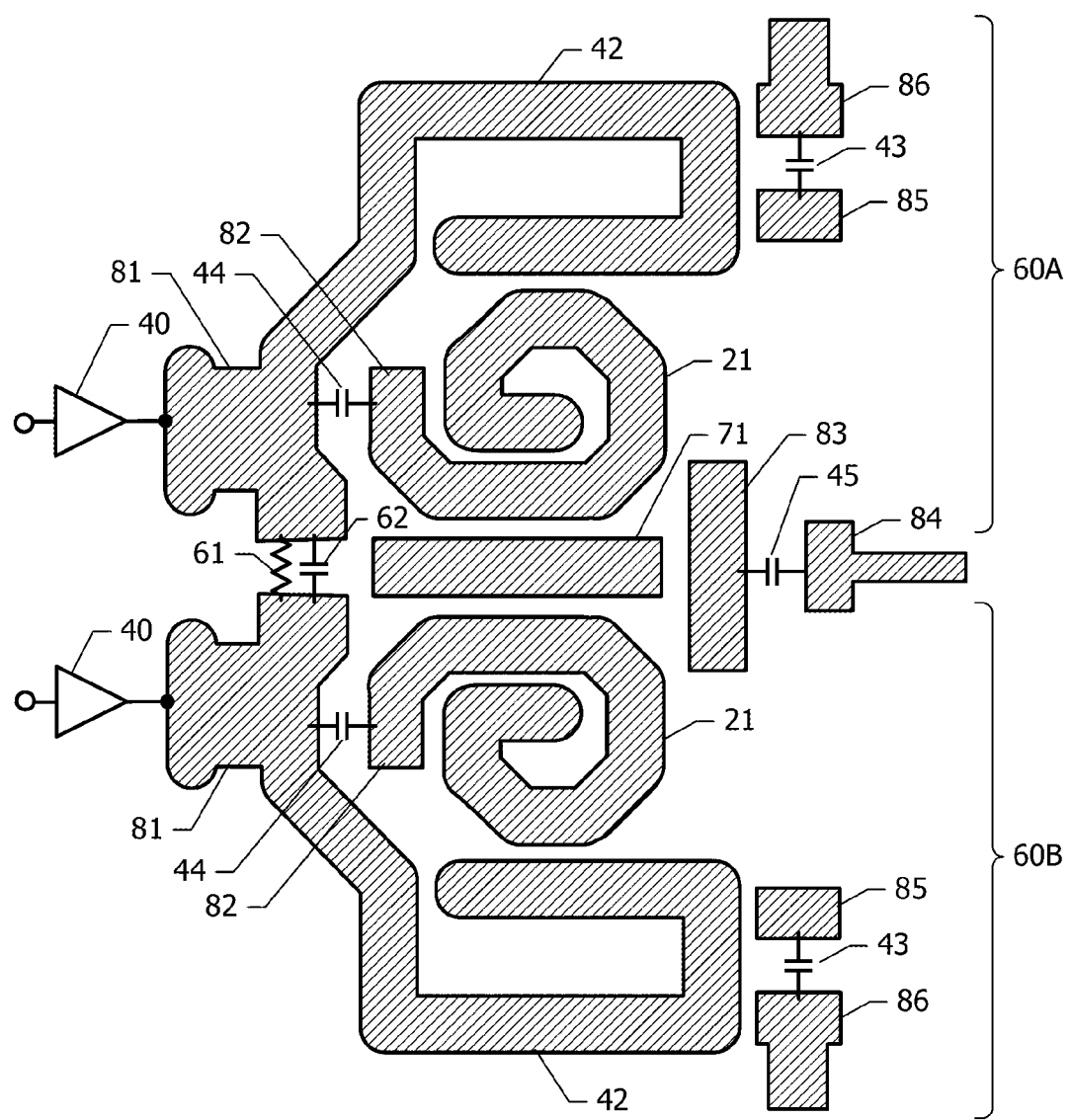
FIG. 18 is a plan view illustrating conductor patterns disposed in a first layer of the amplifying circuit according to the tenth embodiment.

FIG. 18 is a plan view illustrating a plurality of conductor patterns disposed in a first conductor layer of the amplifying circuit according to the tenth embodiment. In FIG. 18, the conductor patterns are hatched. The conductor patterns in the first layer include the first transmission lines 21 and parts of the inductors 42 of the two amplifying systems 60A and 60B, and lands 81, 82, 85, and 86 for mounting surface mount devices. Each first transmission line 21 is constituted by a conductor pattern whose number of turns T is 1. Furthermore, lands 83 and 84 common to the two amplifying systems 60A and 60B are disposed in the first conductor layer.

The conductor patterns constituting the parts of the two inductors 42 are connected to the respective lands 81. The output terminals of the amplifying elements 40 and one terminals of the DC-cut capacitors 44 are connected to the lands 81. Furthermore, the resistance element 61 and the capacitor 62 are connected between the two lands 81. One end portions of the conductor patterns of the first transmission lines 21 are connected to the lands 82. The other terminals of the DC-cut capacitors 44 are connected to the lands 82. The decoupling capacitors 43 are connected between the lands 85 and the lands 86.

The plurality of conductor patterns constituting the amplifying system 60A and the plurality of conductor patterns constituting the amplifying system 60B are axisymmetric in plan view. A grounded conductor pattern 71 is disposed along the symmetry axis between the plurality of conductor patterns constituting the amplifying system 60A and the plurality of conductor patterns constituting the amplifying system 60B. Furthermore, the land 83 and the land 84 are disposed on the symmetry axis. The DC-cut capacitor 45 is connected between the land 83 and the land 84.

Figure 19:
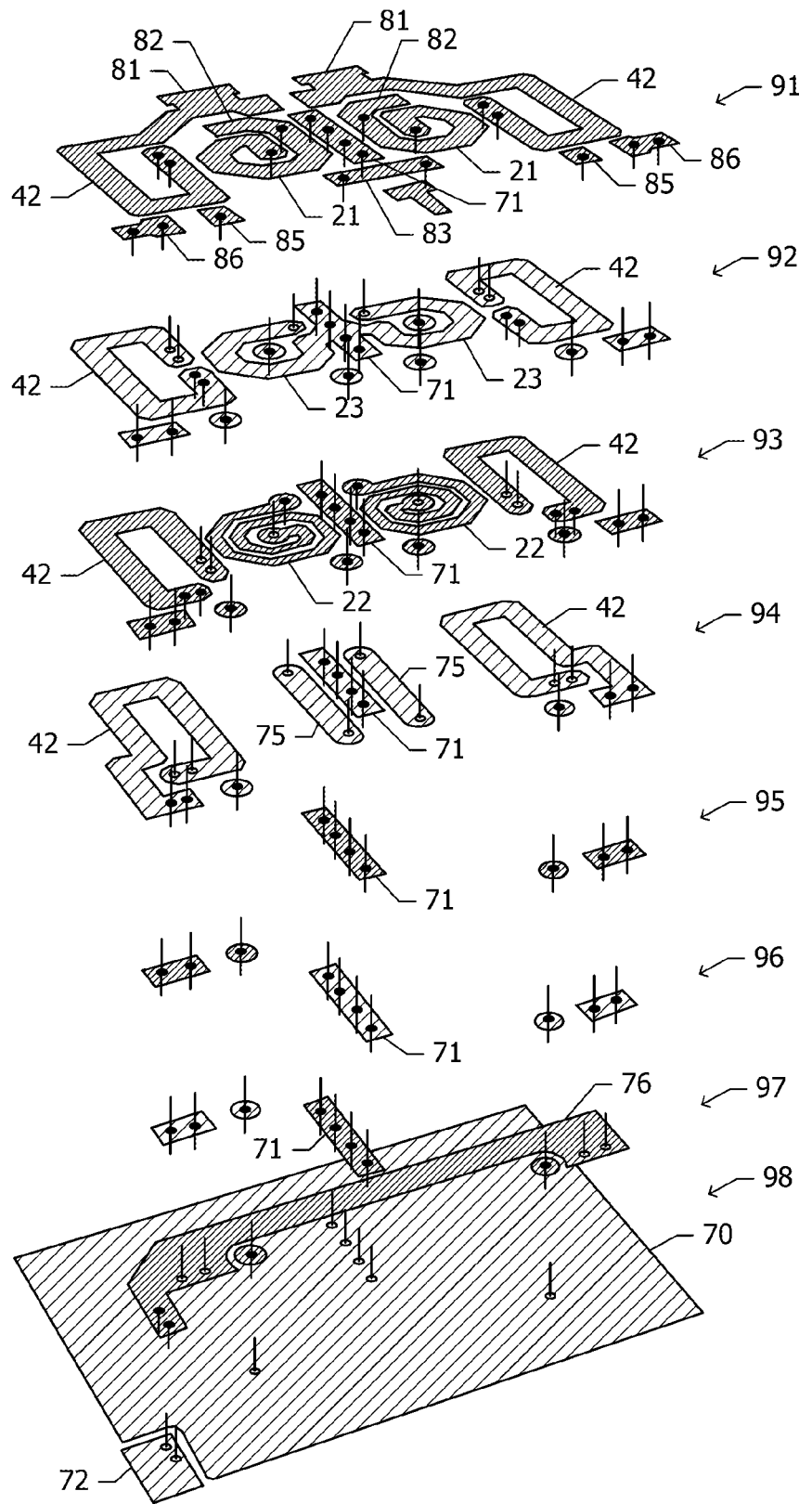
FIG. 19 is an exploded perspective view of a plurality of conductor layers provided in a substrate used for the amplifying circuit according to the tenth embodiment.

FIG. 19 is an exploded perspective view of a plurality of conductor layers provided in the substrate 30 used for the amplifying circuit according to the tenth embodiment. Conductor layers 91 to 98 as first to eighth layers are disposed in order in the thickness direction from a mount surface on which circuit components are mounted. In FIG. 19, the conductor patterns in the odd-numbered conductor layers 91, 93, 95, and 97 are given hatching with a relatively high density, and the conductor patterns in the even-numbered conductor layers 92, 94, 96, and 98 are given hatching with a relatively low density.

The plurality of conductor patterns disposed in the conductor layer 91 as the first layer are as illustrated in FIG. 18. In FIG. 19, a symbol formed of a solid circle and line segments extending upward and downward is given at the position where via conductors connected to both a conductor pattern in an upper layer and a conductor pattern in a lower layer are connected. A symbol formed of a solid circle and a line segment extending downward is given at the position where only a via conductor connected to a conductor pattern in a lower layer is connected. A symbol formed of a hollow circle and a line segment extending upward is given at the position where only a via conductor connected to a conductor pattern in an upper layer is connected.

The grounded conductor pattern 71 is disposed in each of the conductor layers 92 to 97 as the second to seventh layers. The grounded conductor patterns 71 in the individual conductor layers substantially overlap each other in plan view. The grounded conductor patterns 71 adjacent to each other in the vertical direction are connected to each other by four via conductors.

In the conductor layer 98 as the eighth layer, a ground plane 70 and a power supply wiring line 72 are disposed. The grounded conductor pattern 71 in the seventh layer is connected to the ground plane 70 by the four via conductors. In this way, all the grounded conductor patterns 71 in the first to seventh layers are grounded. The power supply wiring line 72 is connected to the power supply circuit 46 (FIG. 17).

The plurality of conductor patterns constituting the two inductors 42 are disposed in the conductor layers 91 to 94 as the first to fourth layers such that two conductor patterns are disposed in each layer. The number of turns T of each conductor pattern in each conductor layer is 1. In each inductor 42, the termination portion of the conductor pattern in the fourth layer constituting the inductor 42 is connected to the land 86 in the first layer, with a plurality of via conductors and the conductor patterns in the third and second layers interposed therebetween. Furthermore, in each inductor 42, the termination portion of the conductor pattern in the fourth layer constituting the inductor 42 is connected to a power supply wiring line 76 in the seventh layer, with the conductor patterns in the fifth and sixth layers and a plurality of via conductors interposed therebetween. The power supply wiring line 76 in the seventh layer is connected to the power supply wiring line 72 in the eighth layer with a plurality of via conductors interposed therebetween.

The lands 85 in the first layer are connected to the ground plane 70, with a plurality of via conductors and the conductor patterns in the second to seventh layers interposed therebetween.

The two third transmission lines 23 are disposed in the conductor layer 92 as the second layer. Each of the third transmission lines 23 is constituted by a conductor pattern whose number of turns T is 1. In each third transmission line 23, one end portion is connected to the grounded conductor pattern 71 in the same conductor layer, whereas the other end portion is connected to the land 82-side end portion of the first transmission line 21, with a via conductor interposed therebetween.

The two second transmission lines 22 are disposed in the conductor layer 93 as the third layer. Each of the second transmission lines 22 is constituted by a substantially spiral conductor pattern whose number of turns T is 2. In each second transmission line 22, the inner end portion is connected to one end portion of the first transmission line 21, with a plurality of via conductors and the conductor pattern in the second layer interposed therebetween. In each second transmission line 22, the outer end portion is connected to a conductor pattern 75 in the fourth layer, with a via conductor interposed therebetween. The conductor pattern 75 is connected to the land 83 in the first layer, with a plurality of via conductors and the conductor patterns in the second and third layers interposed therebetween.

In each of the conductor layers 92 to 96 as the second to sixth layers, the conductor patterns belonging to the amplifying system 60A and the conductor patterns belonging to the amplifying system 60B are axisymmetric, like the conductor patterns in the conductor layer 91 as the first layer.

Next, excellent effects of the tenth embodiment will be described.

In the tenth embodiment, the powers of high-frequency signals outputted from the two amplifying elements 40 are combined, thereby obtaining output power that is about twice (i.e., +3 dB) as much as the power in the case of using a single amplifying element 40. Furthermore, as in the first embodiment, the size of the amplifying circuit can be reduced compared to the configuration of achieving a large impedance transformation ratio by cascade-connecting a plurality of transmission line transformers each having a small impedance transformation ratio. In addition, the number of components can be reduced compared to the case where the impedance transformation circuit is constituted by a plurality of surface mount devices including a capacitor and an inductor. Furthermore, the degradation in characteristics of the amplifying circuit resulting from the variations in characteristics of individual surface mount devices can be suppressed.

The conductor patterns of the amplifying system 60A and the conductor patterns of the amplifying system 60B are axisymmetric, and thus a phase shift of high-frequency signals at the second terminals 32 (FIG. 17) serving as power combining terminals can be suppressed, and the accuracy of phase matching can be increased.

Furthermore, the grounded conductor pattern 71 is disposed between the conductor patterns of the amplifying system 60A and the conductor patterns of the amplifying system 60B. Thus, the leakage of the power from one of the amplifying systems 60A and 60B to the other can be reduced. As a result, the loss caused by leakage of power can be reduced.

Eleventh Embodiment

An amplifying circuit according to an eleventh embodiment will be described with reference to FIG. 20. The same components as those of the amplifying circuit according to the tenth embodiment (FIGS. 17, 18, and 19) will not be described.

Figure 20:
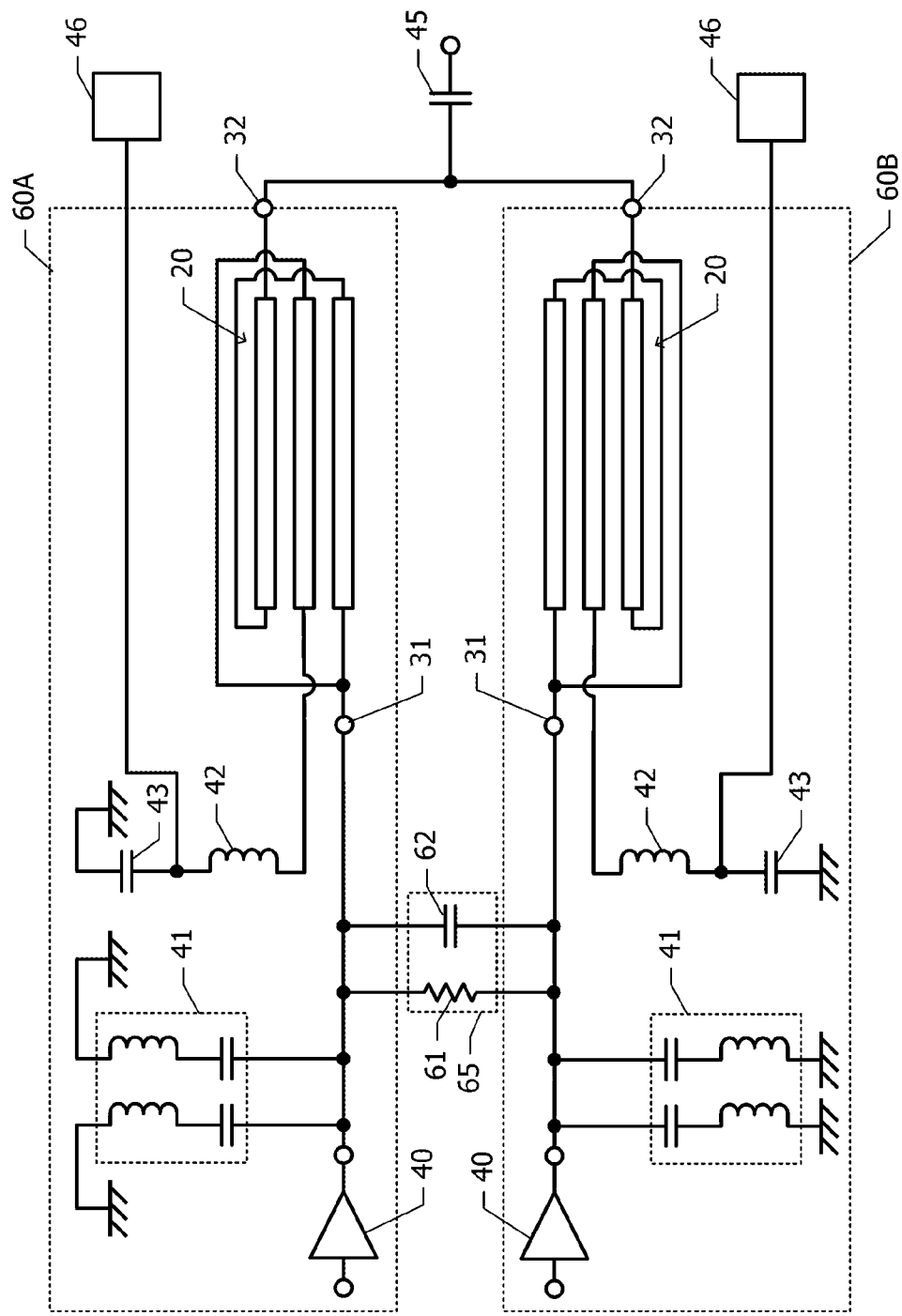
FIG. 20 is an equivalent circuit diagram of an amplifying circuit according to an eleventh embodiment.

FIG. 20 is an equivalent circuit diagram of the amplifying circuit according to the eleventh embodiment. In the tenth embodiment, the configuration from the amplifying element 40 to the second terminal 32 in each of the two amplifying systems 60A and 60B (FIG. 17) is the same as the configuration from the amplifying element 40 to the second terminal 32 of the amplifying circuit according to the fourth embodiment (FIG. 7). In contrast, in the eleventh embodiment, the configuration from the amplifying element 40 to the second terminal 32 in each of the two amplifying systems 60A and 60B is the same as the configuration from the amplifying element 40 to the second terminal 32 of the amplifying circuit according to the fifth embodiment (FIG. 8).

Next, excellent effects of the eleventh embodiment will be described.

In the eleventh embodiment, as in the tenth embodiment, output power about twice as much as the power in the case of using a single amplifying element 40 can be obtained. Furthermore, the degradation in characteristics of the amplifying circuit resulting from the variations in characteristics of individual surface mount devices can be suppressed. Furthermore, as in the fifth embodiment, the DC-cut capacitors 44 according to the tenth embodiment (FIG. 17) are not necessary.

The above-described embodiments are examples, and configurations according to different embodiments can be partially replaced or combined. Similar functions and effects of similar configurations according to a plurality of embodiments are not mentioned for each embodiment. The present disclosure is not limited to the above-described embodiments. It would be obvious to those skilled in the art that various changes, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A transmission line transformer comprising:
a first transmission line and a second transmission line disposed at different positions in a thickness direction of a substrate, the first transmission line and the second transmission line being connected in series to each other; and
a third transmission line disposed between the first transmission line and the second transmission line in the thickness direction of the substrate, the third transmission line including a first end portion connected to one end portion of the first transmission line, and a second end portion that is grounded, wherein:
the first transmission line and the second transmission line are electromagnetically coupled to the third transmission line,
the first transmission line and the second transmission line each have a coil pattern,
the third transmission line has a partially open loop pattern,
the first transmission line coil pattern, the second transmission line coil pattern, and the third transmission line partially open loop pattern each have an origin point, an end point, a path extending from the origin point to the end point, a first point on the path between the origin point and the end point, and a second point on the path between the origin point and the end point, and
a Euclidean distance from the origin point to the first point is a maximum value and a Euclidean distance from the origin point to the second point is a minimum value.

2. The transmission line transformer according to claim 1, wherein starting from a point at which the first transmission line is connected to the third transmission line, the first transmission line and the second transmission line extend to turn in a first turn direction, and the third transmission line extends to turn in a second turn direction that is opposite to the first turn direction.

3. The transmission line transformer according to claim 2, wherein a number of turns of the first transmission line is greater than or equal to a number of turns of the third transmission line, or a number of turns of the second transmission line is greater than or equal to a number of turns of the third transmission line, and the first transmission line and the second transmission line each have a number of turns that is larger than or equal to a number of turns of the third transmission line.

4. The transmission line transformer according to claim 3, wherein the number of turns of the first transmission line or the number of turns of the second transmission line is twice or more the number of turns of the third transmission line.

5. The transmission line transformer according to claim 1, wherein:
the first transmission line, the second transmission line, and the third transmission line each comprise a conductor pattern whose dimension is larger in a width direction than in the thickness direction, and
the conductor pattern of the first transmission line, the conductor pattern of the second transmission line, and the conductor pattern of the third transmission line overlap each other at least partially in plan view.

6. The transmission line transformer according to claim 5, wherein:
the conductor pattern of the third transmission line has a width that is larger than or equal to a width of the conductor pattern of the first transmission line and a width of the conductor pattern of the second transmission line, and
the conductor pattern of the first transmission line and the conductor pattern of the second transmission line are disposed inside the conductor pattern of the third transmission line in the width direction.

7. The transmission line transformer according to claim 5, wherein the conductor pattern of the first transmission line has a width that is larger than a width of the conductor pattern of the second transmission line.

8. The transmission line transformer according to claim 1, wherein the first transmission line and the second transmission line connected in series to each other form a transmission line such that an alternating current flowing through the transmission line induces an odd-mode current flowing through the third transmission line, the odd-mode current flowing in a direction opposite to a direction in which the alternating current flows.

9. The transmission line transformer according to claim 8, wherein the first transmission line and the second transmission line each have a substantially spiral pattern in plan view.

10. The transmission line transformer according to claim 1, wherein:
the first transmission line includes a third end portion that is the one end portion, the third end portion being connected to the first end portion of the third transmission line and to an external circuit, and a fourth end portion opposite to the third end portion,
the second transmission line includes a fifth end portion connected to the fourth end portion, and a sixth end portion that is opposite to the fifth end portion, the sixth end portion being connected to an external circuit,
a current flowing through the first transmission line from the third end portion toward the fourth end portion induces an odd-mode current flowing through the third transmission line from the first end portion toward the second end portion, and
a current flowing through the second transmission line from the fifth end portion toward the sixth end portion induces an odd-mode current flowing through the third transmission line from the first end portion toward the second end portion.

11. The transmission line transformer according to claim 10, wherein the first transmission line and the second transmission line each have a substantially spiral pattern in plan view.

12. An amplifying circuit comprising:
at least one amplifying system,
each of the at least one amplifying system including:
an amplifying element that amplifies a high-frequency signal, and a transmission line transformer connected to an input terminal of the amplifying element or an output terminal of the amplifying element, the transmission line transformer including:
- a first transmission line and a second transmission line disposed at different positions in a thickness direction of a substrate, the first transmission line and the second transmission line being connected in series to each other, and
- a third transmission line disposed between the first transmission line and the second transmission line in the thickness direction of the substrate, the third transmission line including a first end portion connected to one end portion of the first transmission line, the one end portion being connected to the amplifying element, and a second end portion that is AC-grounded, wherein:

the first transmission line and the second transmission line are electromagnetically coupled to the third transmission line, the first transmission line and the second transmission line each have a coil pattern, the third transmission line has a partially open loop pattern, the first transmission line coil pattern, the second transmission line coil pattern, and the third transmission line partially open loop pattern each have an origin point, an end point, a path extending from the origin point to the end point, a first point on the path between the origin point and the end point, and a second point on the path between the origin point and the end point; and a Euclidean distance from the origin point to the first point is a maximum value and a Euclidean distance from the origin point to the second point is a minimum value.

13. The amplifying circuit according to claim 12, further comprising:
two amplifying systems of the at least one amplifying system, wherein:
- the second transmission lines of the two amplifying systems each include a fifth end portion connected to the first transmission line and a sixth end portion opposite to the fifth end portion, the sixth end portions being connected to each other, and
- the transmission line transformers of the two amplifying systems are each connected to the output terminal of the amplifying element of the corresponding amplifying system;
- a DC-cut capacitor including one electrode connected to the sixth end portions that are connected to each other; and
- an inter-system phase-shift circuit connected between the output terminals of the amplifying elements of the two amplifying systems, wherein:

a signal path extending from the output terminal of the amplifying element of a first amplifying system of the two amplifying systems to the output terminal of the amplifying element of a second amplifying system of the two amplifying systems includes a first path including the transmission line transformers and a second path including the inter-system phase-shift circuit, and a difference between an amount of phase change in a signal transmitted through the first path and an amount of phase change in a signal transmitted through the second path is about 180 degrees.

14. The amplifying circuit according to claim 13, wherein the first transmission line, the second transmission line, and the third transmission line of the first amplifying system and the first transmission line, the second transmission line, and the third transmission line of the second amplifying system are axisymmetric in plan view of the substrate.

15. The amplifying circuit according to claim 14, further comprising a grounded conductor pattern disposed between a set of the first transmission line, the second transmission line, and the third transmission line of the first amplifying system and a set of the first transmission line, the second transmission line, and the third transmission line of the second amplifying system in plan view of the substrate.

16. The amplifying circuit according to claim 12, wherein the second end portion of the third transmission line is connected to a power supply circuit, and the amplifying element is supplied with DC power through the third transmission line.

17. The transmission line transformer according to claim 12, wherein the first end portion has a different connection than the second end portion.

18. The transmission line transformer according to claim 12, wherein the first end portion has a different connection than the second end portion.

19. The transmission line transformer according to claim 1, wherein the second point is closer to the end point along the path than to the origin point.

20. The transmission line transformer according to claim 12, wherein the second point is closer to the end point along the path than to the origin point.

* * * * *